US011678473B2

(12) United States Patent
Flores et al.

(10) Patent No.: US 11,678,473 B2
(45) Date of Patent: Jun. 13, 2023

(54) SEMIAUTOMATIC MACHINE FOR SWAGING CONNECTOR PINS

(71) Applicant: Concord Electronics, Inc., Long Island City, NY (US)

(72) Inventors: Agustin Flores, Bronx, NY (US); Richard Guiterrez, New York, NY (US); Omar Gonzalez, Leonia, NJ (US)

(73) Assignee: Concord Electronics, Inc., Long Island City, NY (US)

( * ) Notice: Subject to any disclaimer, the term of this patent is extended or adjusted under 35 U.S.C. 154(b) by 0 days.

(21) Appl. No.: 17/742,321

(22) Filed: May 11, 2022

(65) Prior Publication Data

US 2022/0272882 A1   Aug. 25, 2022

Related U.S. Application Data

(63) Continuation of application No. 16/815,813, filed on Mar. 11, 2020, now Pat. No. 11,363,749.

(Continued)

(51) Int. Cl.
*H05K 13/02* (2006.01)
*H05K 13/04* (2006.01)

(52) U.S. Cl.
CPC ......... *H05K 13/029* (2013.01); *H05K 13/043* (2013.01); *Y10T 29/49153* (2015.01)

(58) Field of Classification Search
CPC .. H05K 13/028; H05K 13/029; H05K 13/043; H05K 13/0443; H05K 13/0456; H05K 13/0473; Y10T 29/4914; Y10T 29/49147; Y10T 29/49151; Y10T 29/49218; Y10T 29/49153; Y10T 29/49956; Y10T 29/532; Y10T 29/53204; Y10T 29/53209; Y10T 29/5327; Y10T 29/53387; H01R 12/585; H01R 43/048; H01R 43/055; H01R 43/205

See application file for complete search history.

(56) References Cited

U.S. PATENT DOCUMENTS

| 4,099,324 | A | * | 7/1978 | Johnson | ............... | H05K 13/043 |
| | | | | | | 29/761 |
| 5,318,496 | A | * | 6/1994 | Takahashi | .............. | B21D 28/12 |
| | | | | | | 483/1 |

(Continued)

*Primary Examiner* — Peter Dungba Vo
*Assistant Examiner* — Joshua D Anderson
(74) *Attorney, Agent, or Firm* — Pillsbury Winthrop Shaw Pittman, LLP

(57) ABSTRACT

A machine that is used to automate the assembly of a circuit board assembly is provided. The machine includes a rotating indexer, at least one anvil holder, a punch, and an activation switch. The at least one anvil holder is carried by the rotating indexer and is configured to receive a connector pin. The anvil holder is rotatable relative to the punch, such that the at least one anvil holder may be aligned with the punch. A circuit board may be located about the connector pin, after which the activation switch may be activated to cause movement of the punch towards the anvil holder. When this occurs, the connector pin is compressed, which causes the connector pin to be secured to the circuit board. More specifically, a top section of the connector pin is compressed to form a top lip, where the circuit board is located between the top lip and a shoulder of the connector pin.

16 Claims, 24 Drawing Sheets

Related U.S. Application Data

(60) Provisional application No. 62/817,110, filed on Mar. 12, 2019.

(56) References Cited

U.S. PATENT DOCUMENTS

| | | | | |
|---|---|---|---|---|
| 6,148,707 A | * | 11/2000 | Kouno | B21D 28/12 83/552 |
| 2005/0257659 A1 | * | 11/2005 | Yeh | B23P 19/062 83/651 |

* cited by examiner

SEMIAUTOMATIC MACHINE FOR SWAGING CONNECTOR PINS

This application is a continuation of U.S. patent application Ser. No. 16/815,813, titled "SEMIAUTOMATIC MACHINE FOR SWAGING CONNECTOR PINS," filed 11 Mar. 2020, which claims the benefit of U.S. Provisional Patent Application 62/817,110, titled "SEMIAUTOMATIC MACHINE FOR SWAGING CONNECTOR PINS," filed Mar. 12, 2019. Each afore-mentioned patent filing is hereby incorporated by reference in its entirety and for all purposes as if completely and fully set forth herein.

FIELD OF TILE INVENTION

The present invention relates to the manufacturing of circuit board assemblies and a device to help simplify the manufacturing process of circuit board assemblies. Specifically, the present invention relates to a machine that swags connector pins associated with a circuit board assembly, aligns the connector pins in the correct location, and presses the connector pins into place against the circuit board. The present invention helps to ensure consistent pressure is applied during pin insertion, which in turn increase the quality and productivity of assembly of the circuit board assemblies.

BACKGROUND

Circuit board assemblies are routinely manufactured by attaching a variety of different connector pins to a circuit board. For instance, various connector pins may be located relative to a circuit board, after which they are soldered or welded to the circuit board. Traditionally, each connector pin was individually and manually located relative to the circuit board, after which it could be secured thereto. Because this was done separately for each connector pin, oftentimes this could result in issues with consistency of the resulting circuit board assemblies. Additionally, the process required substantial manual labor.

Thus, what is needed is a manufacturing process and related device that allows for the automated securement of connector pins to the circuit board. What is further needed is a manufacturing process and related device that allows for consistent installation of the connector pins to the circuit board. What is also needed is a system that enables connector pins to be pressed against the circuit board to form a secure connection between the connector pin and the circuit board.

SUMMARY

The present invention provides a machine and method for automated assembly of a circuit board assembly having a circuit board and at least one connector pin. The machine and method simplify and expedite the process of assembling a circuit board assembly while also increasing consistency and quality.

According to an exemplary embodiment, the machine includes a rotating indexer, at least one anvil holder carried by the rotating indexer, a punch, and an actuation switch. The at least one anvil holder is configured to receive a connector pin. The punch is configured to be moved along an axis relative to the rotating indexer when the actuation switch is actuated. As a result of these movements, the punch is pressed against the anvil holder to secure the at least one connector pin to the circuit board. As a result, a top section of the connector pin may be compressed to form a top lip, where the circuit board is held in place between the top lip and a shoulder of the connector pin. Additionally, the machine may include a feeding bowl that contains at least one connector pin, as well as a feeder track that extends from the feeding bowl to the rotating indexer. As such, the at least one connector pin may be moved from the feeding bowl to the track, and then from the track into the at least one anvil holder of the rotating indexer.

According to another aspect of the invention, various vibrators may be mounted to the machine to encourage movement of the at least one connector pin from the feeding bowl to the track. For instance, a first vibrator may be mounted to the feeding bowl and a second vibrator may be mounted to the track. The amount of vibrations caused by the first vibrator and the second vibrator may be adjusted based on the desired movement characteristics of the at least one connector pin relative to the feeding bowl and the track, for instance using a first knob and a second knob.

According to another aspect of the invention, the machine may be adjusted for use with connector pins having different dimensions. For instance, the track may be adjustable to accommodate different connector pins. The track may be adjustable in a first direction to account for connector pins having different heights, and the track may also be adjustable in a second direction to account for connector pins having different diameters. Additionally, the machine may have at least one adapter that is mounted to the track to enable movement of connector pins having different dimensions. For instance, a first adapter may be provided that has a first width that is compatible with a first connector pin and a second adapter may be provided that has a second width that is compatible with a second connector pin. In this way, the adapters can easily be switched when the desired circuit board assembly requires connector pins having different sizes.

According to another aspect of the invention, a method for using a machine for automated assembly of a circuit board assembly includes aligning at least one anvil holder container on a rotary indexer with a punch that is vertically offset from the rotary indexer, automatically feeding at least one connector pin into the at least one anvil holder, placing a circuit board adjacent to the connector pin, actuating an actuation switch, moving the punch towards the rotary indexer, and swaging the connector pin to the circuit board by compressing the punch against the anvil holder. Additionally, the swaging step may further include the steps of compressing a top section of the at least one connector pin by the punch to form a top lip and holding the circuit board between a shoulder of the at least one connector pin and the top lip. Further still, the method may including inserting a plurality of connector pins into a feeding bowl, guiding the connect pins from the feeding bowl towards a feeder track, guiding the connector pins along the feeder track towards the rotary indexer, and depositing at least one of the connector pins from the feeder track into the anvil holder. The method may also include the steps of adjusting a first knob associated with a first vibrator that is attached to the feeding bowl to increase or decrease the amount of vibration to the feeding bowl, and adjusting a second knob associated with a second vibrator attached to the feeder track to similarly increase or decrease the amount of vibration to the feeder track. Furthermore, the method may include the steps of guiding the connector pins from the feeding bowl towards the feeder track based on vibrations of the first vibrator and the slope of the feeding bowl and guiding the connector pins along the feeder track towards the rotary indexer using the second vibrator. Additionally, the method may include the step of realigning the at least one anvil holder with the punch.

Other features and advantages of the invention will become apparent to those skilled in the art from the following detailed description and accompanying drawings. It should be understood, however, that the detailed description and specific examples, while indicating the preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Preferred exemplary embodiments of the invention are illustrated in the accompanying drawings in which like reference numerals represent like parts throughout, and in which.

Figure 1:
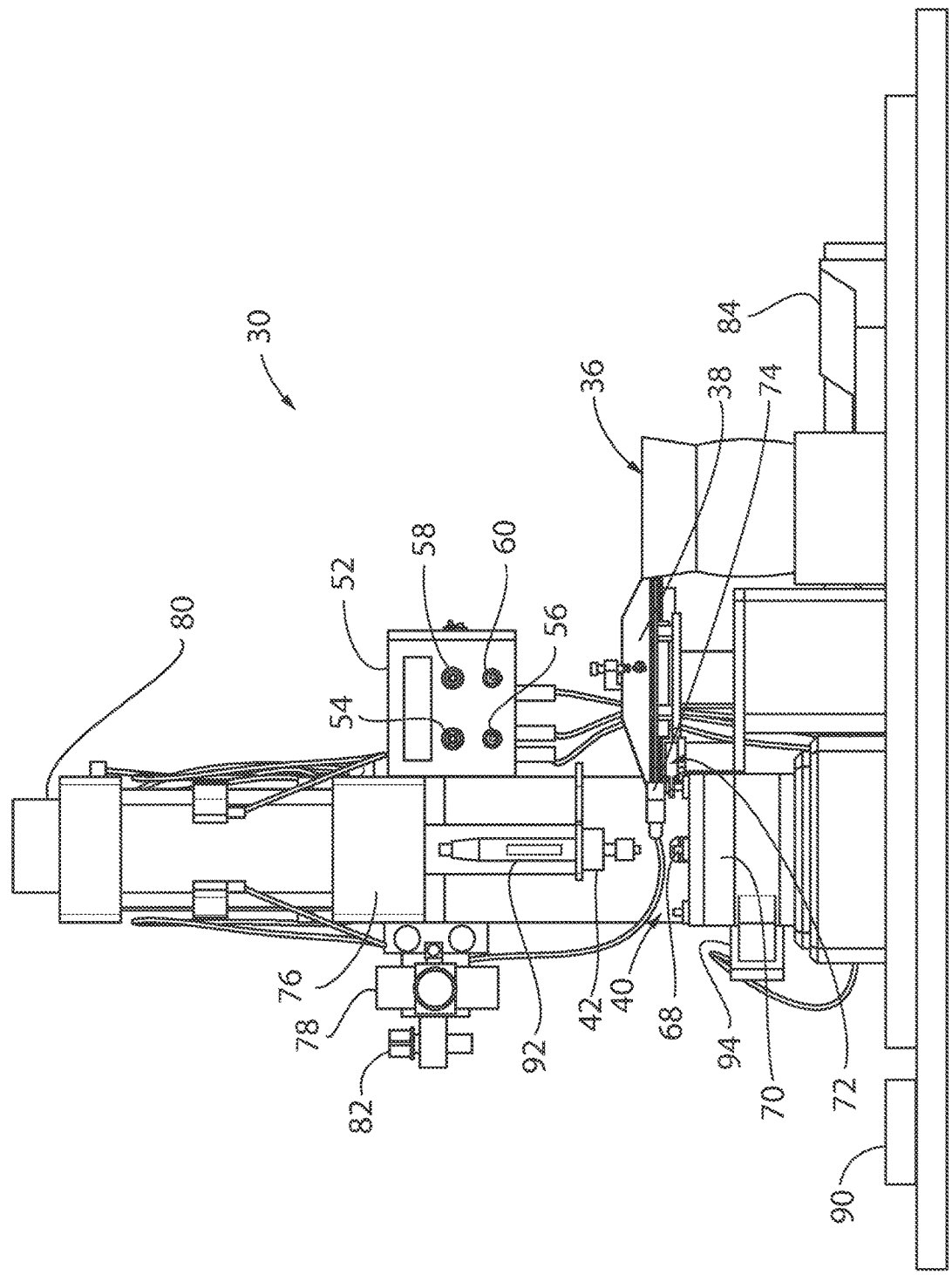
FIG. 1 is a front elevation view of a semiautomatic machine for swaging connector pins of an exemplary embodiment.

Before explaining embodiments of the invention in detail, it is to be understood that the invention is not limited in its application to the details of construction and the arrangement of the components set forth in the following description and illustrated in the drawings. The invention is capable of other embodiments or being practiced or carried out in various ways. Also, it is to be understood that the phraseology and terminology employed herein is for the purpose of description and should not be regarded as limiting.

DETAILED DESCRIPTION

Figure 25:
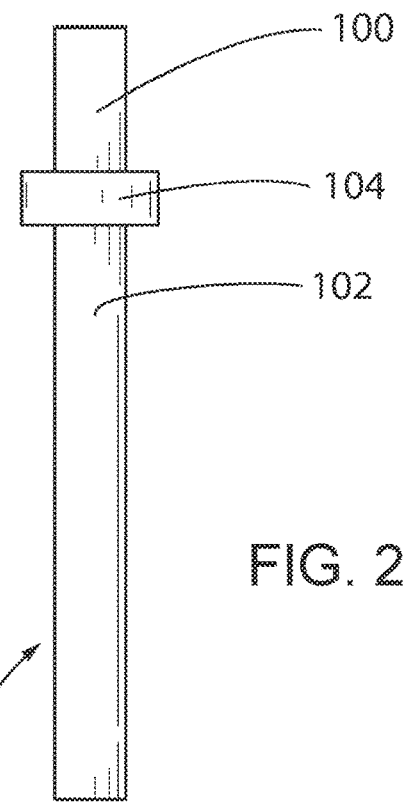
FIG. 25 is a side elevation view of a connector pin used with the present circuit board assembly.
Figure 26:
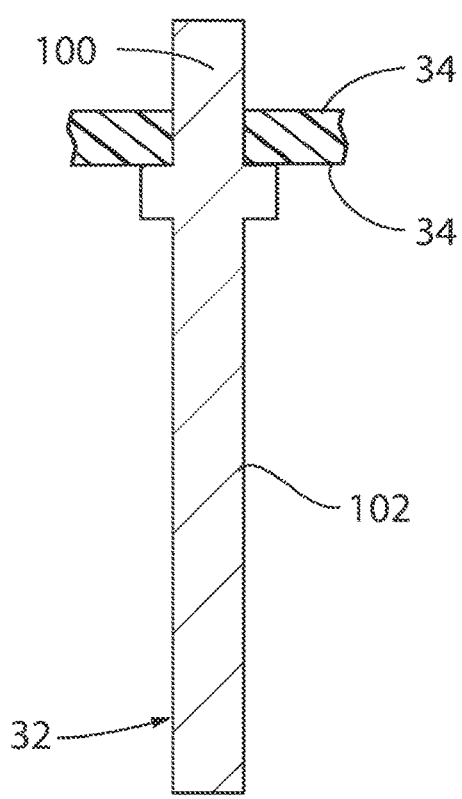
FIG. 26 is a side elevation view of a connector pin and a circuit board of the present circuit board assembly.
Figure 27:
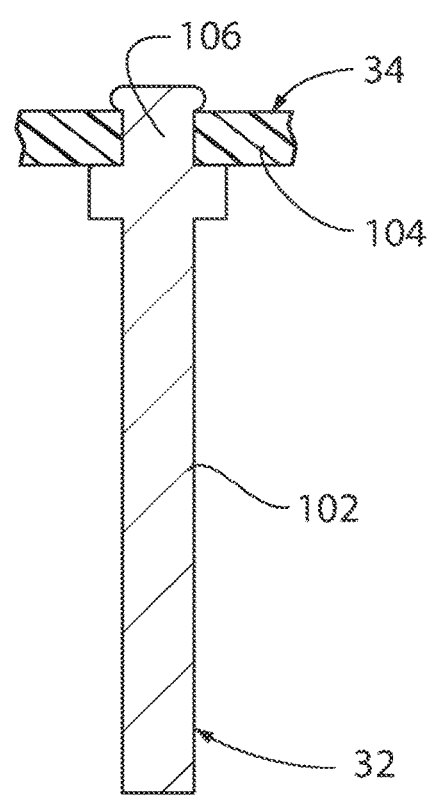
FIG. 27 is a side elevation view of the connector pin and circuit board of FIG. 26 once the connector pin has been swaged.

Referring to the following description in which like reference numerals represent like parts throughout the disclosure, a semiautomatic machine 30 for swaging connector pins 32 to circuit board assemblies 34 is shown in the figures. More specifically, the machine 30 is used to press connector pins 32 into place against circuit board assemblies 34. Swaging is an alternative or supplement to soldering the pins 32 to the circuit board assemblies 34. Each of the pins 32 shown in the figures has a top section 100, a bottom section 102, and a shoulder 104 located between the top section 100 and the bottom section 102. See FIG. 25. As will further be described below, the machine 30 results in the compression of the pin 32 such that the top section 100 is compressed against the circuit board assembly 34, such that a top lip is created, where the circuit board assembly 34 is secured between the shoulder 104 and the top lip 106. See FIGS. 26 and 27.

A variety of different sized connector pins 32 can be pressed against various circuit board assemblies 34. For instance, some pins 32 have a hollow end that is pressed against the circuit board assembly 34 to form a mushroom-shaped retaining head. Typical connector pins 32 may have a variety of diameters, as shown, between 0.017 and 0.093 inches (0.43-2.36 millimeters). The present inventive machine 30 helps to automate the swaging process to ensure consistency of pressure for the pin insertion. In turn, this improves the quality and productivity of assembly of the circuit board assemblies 34. Additionally, the inventive machine 30 can be retrofitted to be used with existing machinery to again improve the quality and productivity of assembling circuit board assemblies 34.

As shown generally in the figures, the machine 30 has a number of different features that work together to expedite the efficiency of the swaging of the connector pins 32. These may include a feeding bowl 36 configured to house a supply of the connector pins 32, a feeder track 38 that is located directly adjacent to the feeding bowl 36, a rotary indexer 40 configured to receive the connector pins 32, and a punch 42 that is vertically movable relative to the rotary indexer 40.

Figure 5:
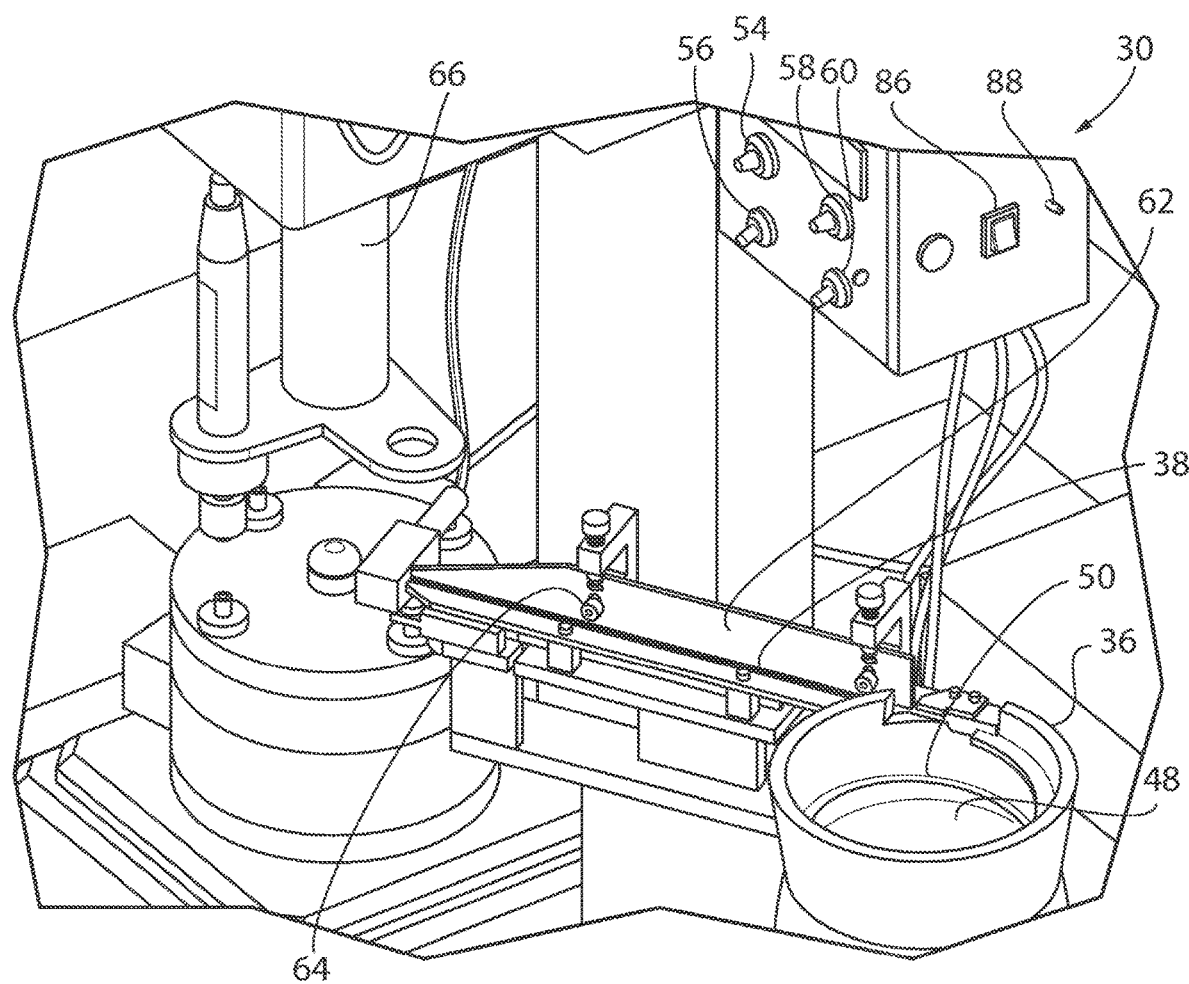
FIG. 5 is a front side perspective view of the semiautomatic machine for swaging connector pins of FIGS. 1-4 showing the feeder bowl before a plurality of connector pins have been inserted therein.
Figure 7:
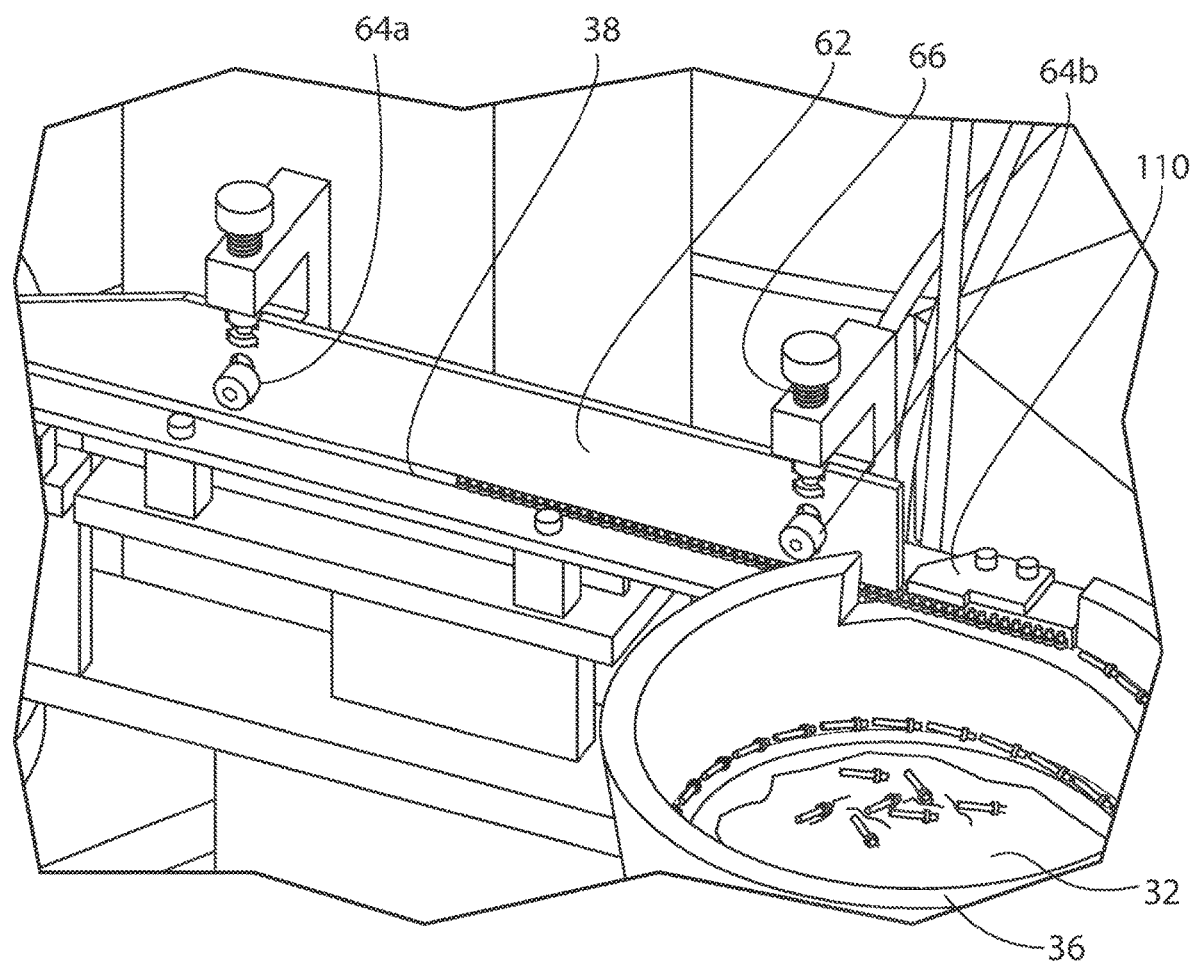
FIG. 7 is a front side perspective view of the semiautomatic machine for swaging connector pins of FIGS. 5 and 6 showing the plurality of connector pins being moved from the feeder bowl onto the feeder track.
Figure 8:
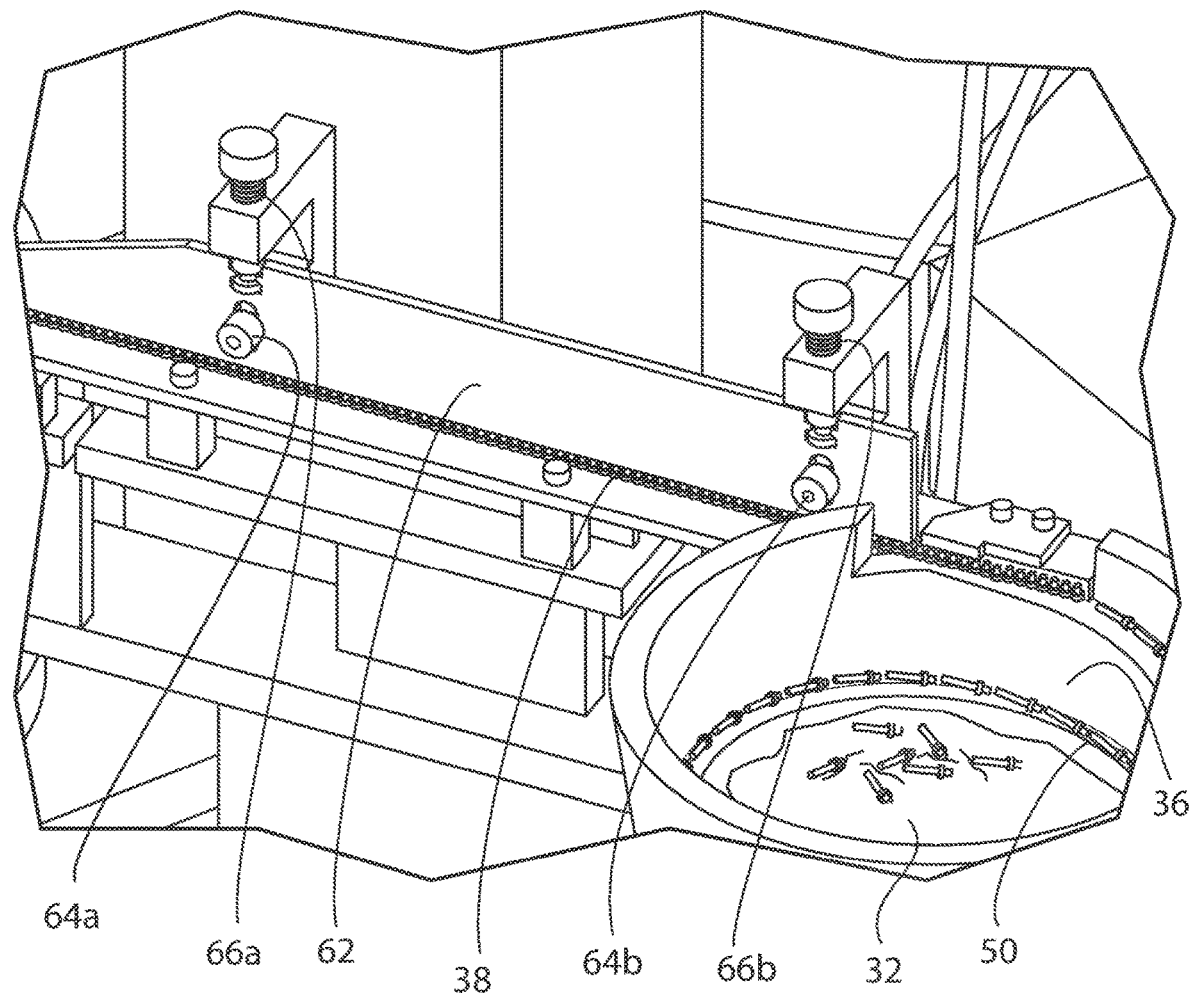
FIG. 8 is a front side perspective view of the semiautomatic machine for swaging connector pins of FIGS. 5-7 showing the feeder track once it has been populated with the plurality of connector pins.
Figure 9:
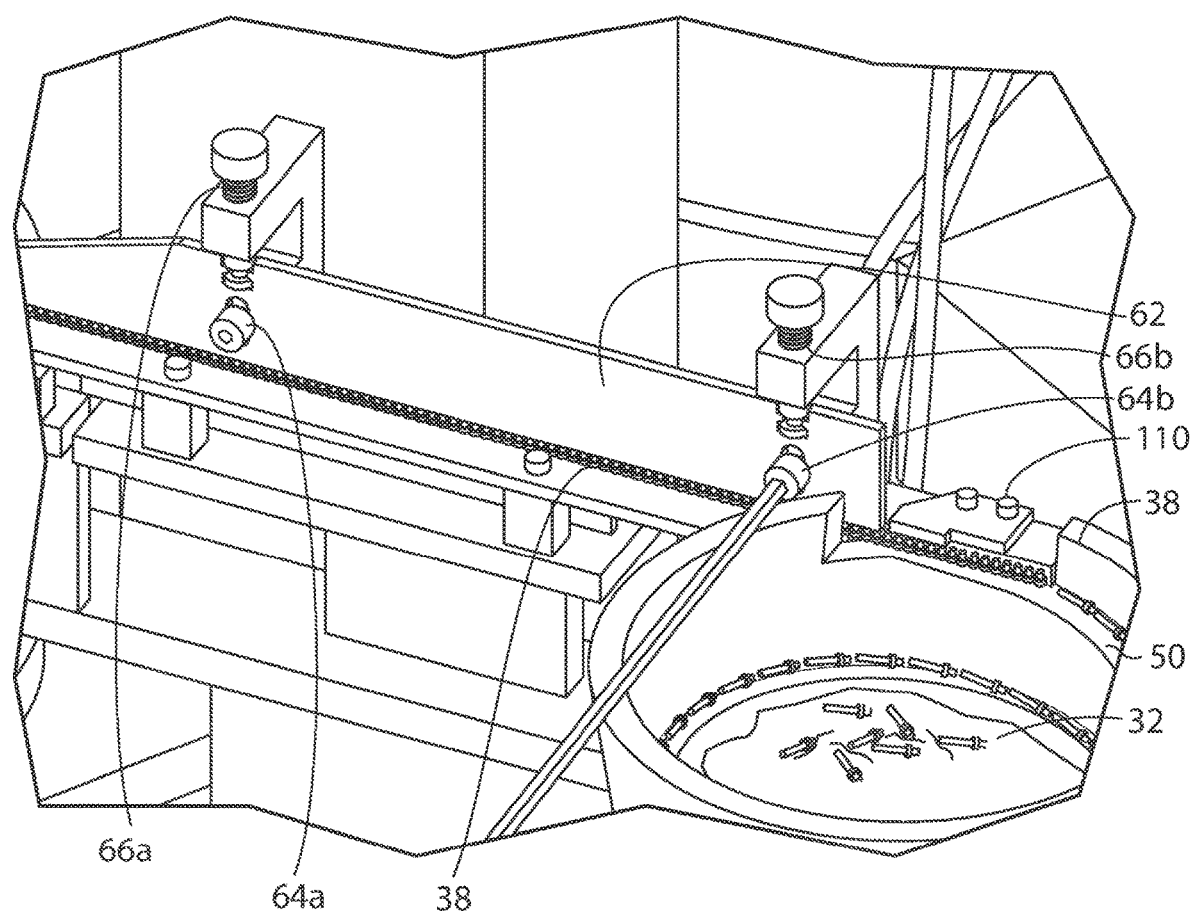
FIG. 9 is a front side perspective view of the semiautomatic machine for swaging connector pins where horizontal fasteners associated with an adapter are adjusted.

The feeding bowl 36 and feeder track 38 are used to deliver connector pins 32 to the rotary indexer 40. To achieve this movement, both the feeding bowl 36 and the feeder track 38 may have various vibrator mechanisms mounted thereto. For instance, a first vibrator (not shown) may be mounted to the feeding bowl 36 and a second vibrator (not shown) may be mounted to the feeder track 38. Based on the shape of the feeding bowl 36 and the vibration of the vibrator mounted to the feeding bowl 36, connector pins 32 can automatically and continuously be fed into the feeder track 38. For instance, as shown in FIG. 5, the feeding bowl 36 may have a sloped bottom surface 48 as well as a sloped lip 50 that extends around the perimeter of the feeding bowl 36. As the first vibrator vibrates the interior of the feeding bowl 36, the connector pins 32 naturally travel up and along the sloped lip 50. Once a connector pin 32 reaches the top of the sloped lip 50, as can be seen in FIGS. 7-9, it is fed into the feeder track 38. Due to the shape and weight of the pins 32, each pin 32 will naturally correctly align itself in the feeder track 38. For instance, the top section 100 of each pin 32 is upwardly located and the bottom section 102 of the pin 32 is located therebeneath. As can be seen in the figures, the shoulder 104 of each pin 32 has a diameter that is greater than the width of a slot 108 defined by the track 38. Thus, the shoulder 104 serves multiple purposes, including to help locate the pin 32 relative to the slot 108, and further to secure the pin 32 relative to the circuit board assembly 34 where the circuit board assembly 34 is located between the shoulder 104 and the top lip 106. The pins 32 move along the track 38 by movement of the shoulder 104 of each pin 32 on the track 38, with the lower portion of the pin 32 moving within the slot 108 defined by the track 38.

Figure 10:
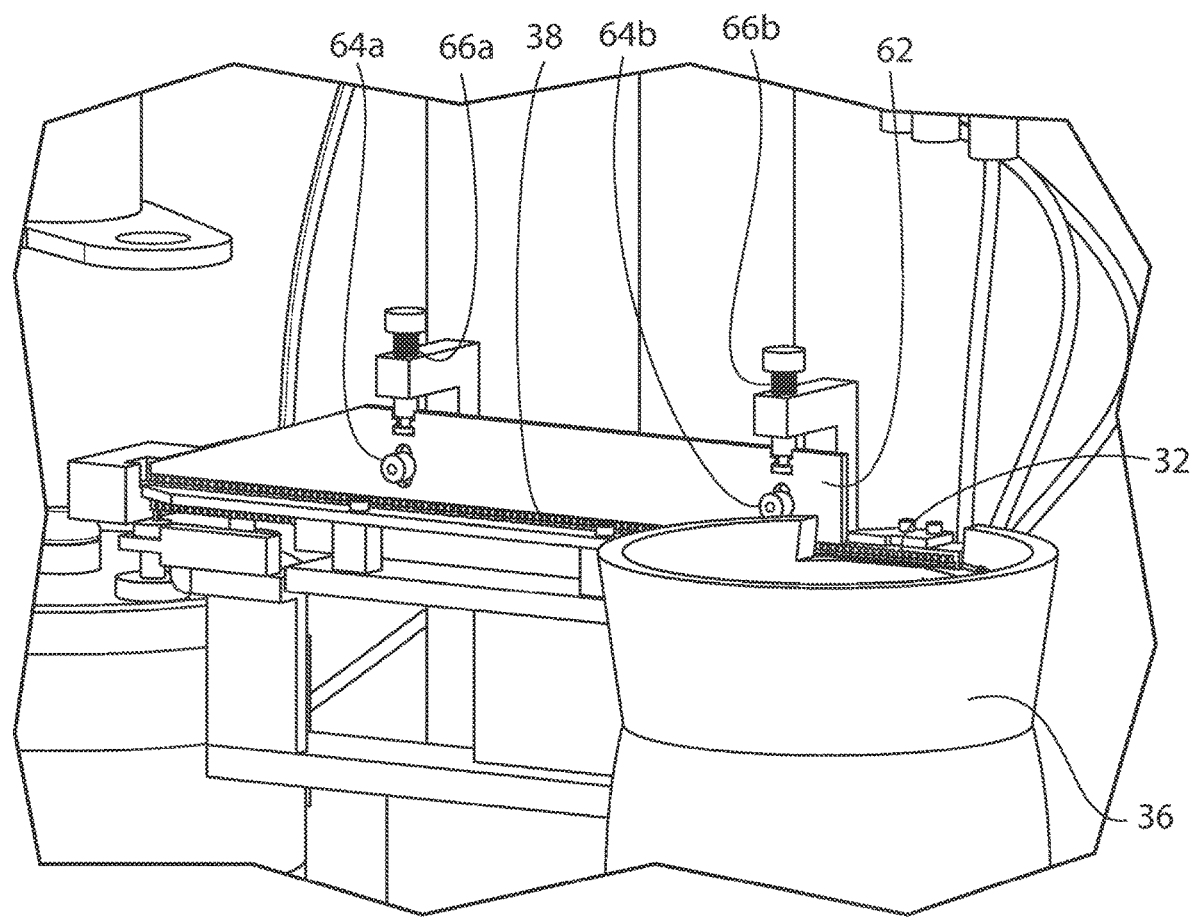
FIG. 10 is another front side perspective view of the semiautomatic machine for swaging connector pins showing the feeder track once it has been populated with the plurality of connector pins.
Figure 11:
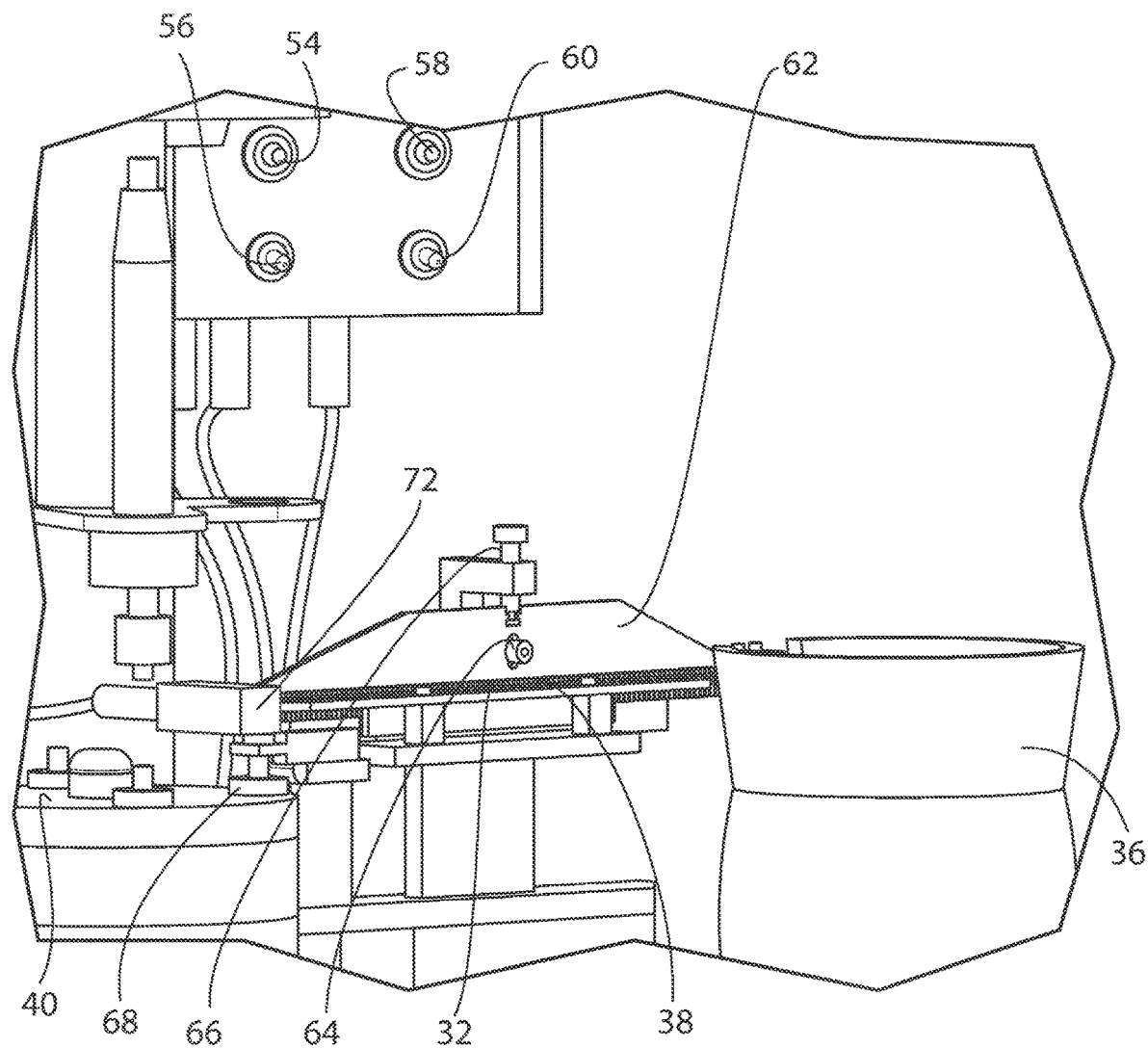
FIG. 11 is a front side perspective view of the semiautomatic machine for swaging connector pins where a different adapter is installed adjacent to the feeder track.
Figure 12:
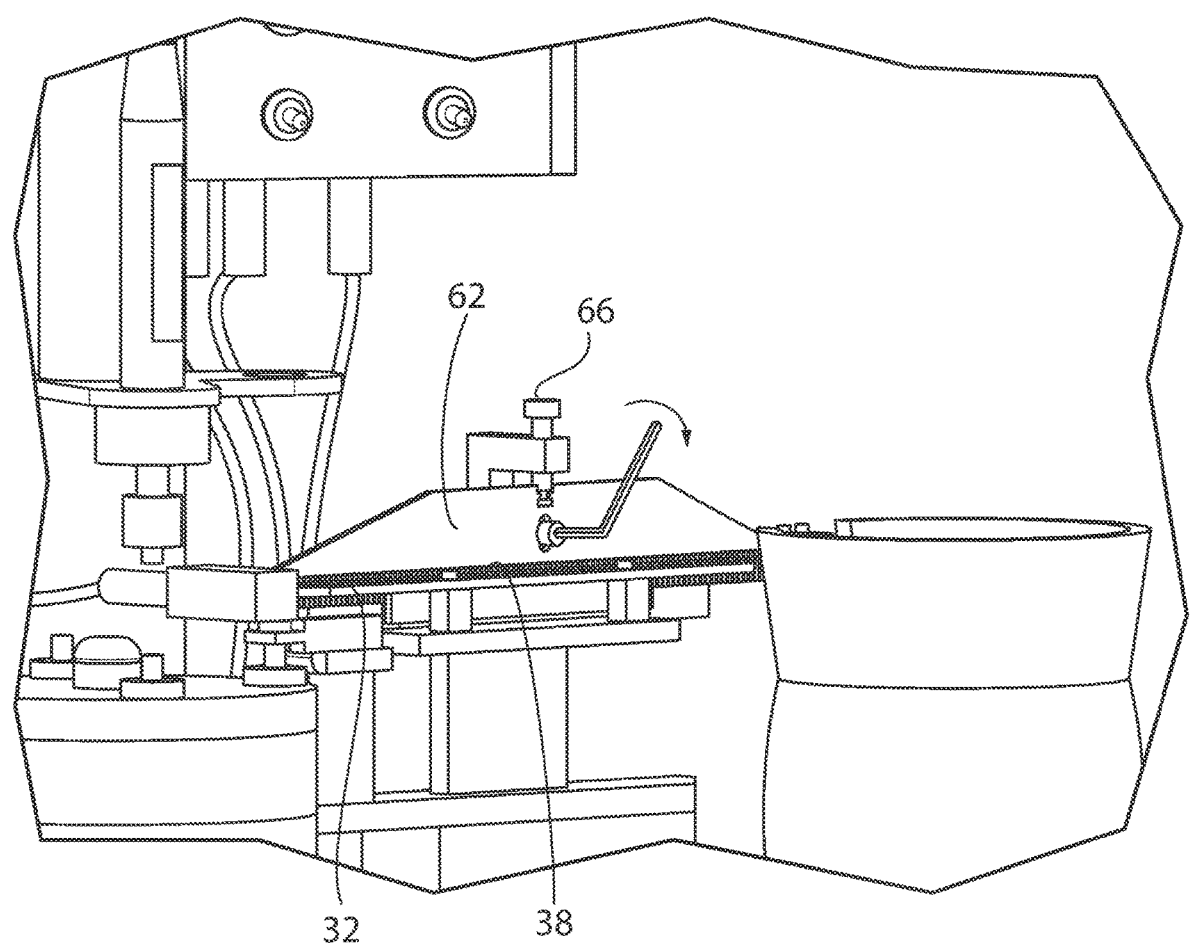
FIG. 12 is a front side perspective view of the semiautomatic machine for swaging connector pins of FIG. 11 where a horizontal fastener is adjusted to change the height of the adapter relative to the feeder track.
Figure 13:
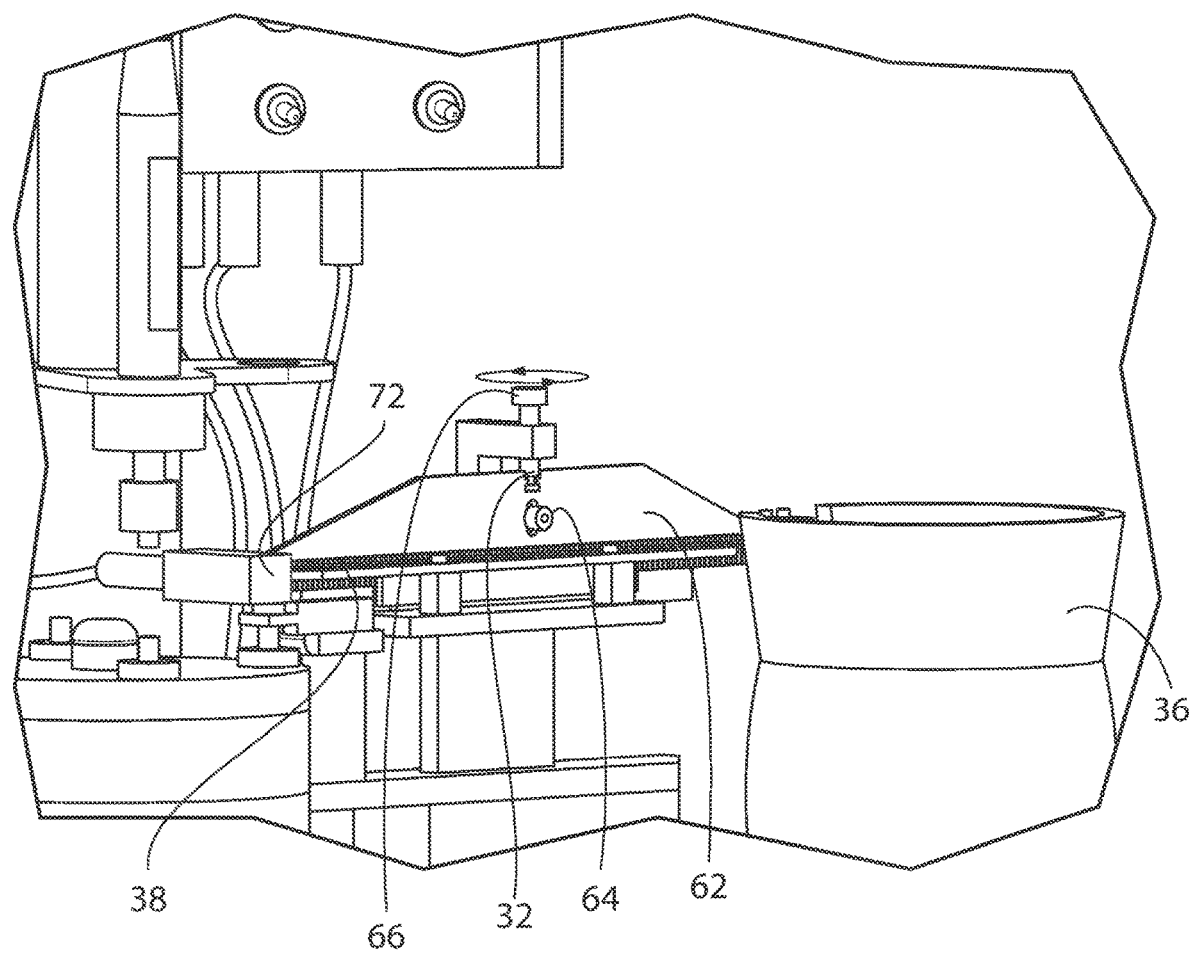
FIG. 13 is a front side perspective view of the semiautomatic machine for swaging connector pins of FIGS. 11 and 12 where a vertical fastener is adjusted to change the height of the adapter relative to the feeder track.
Figure 14:
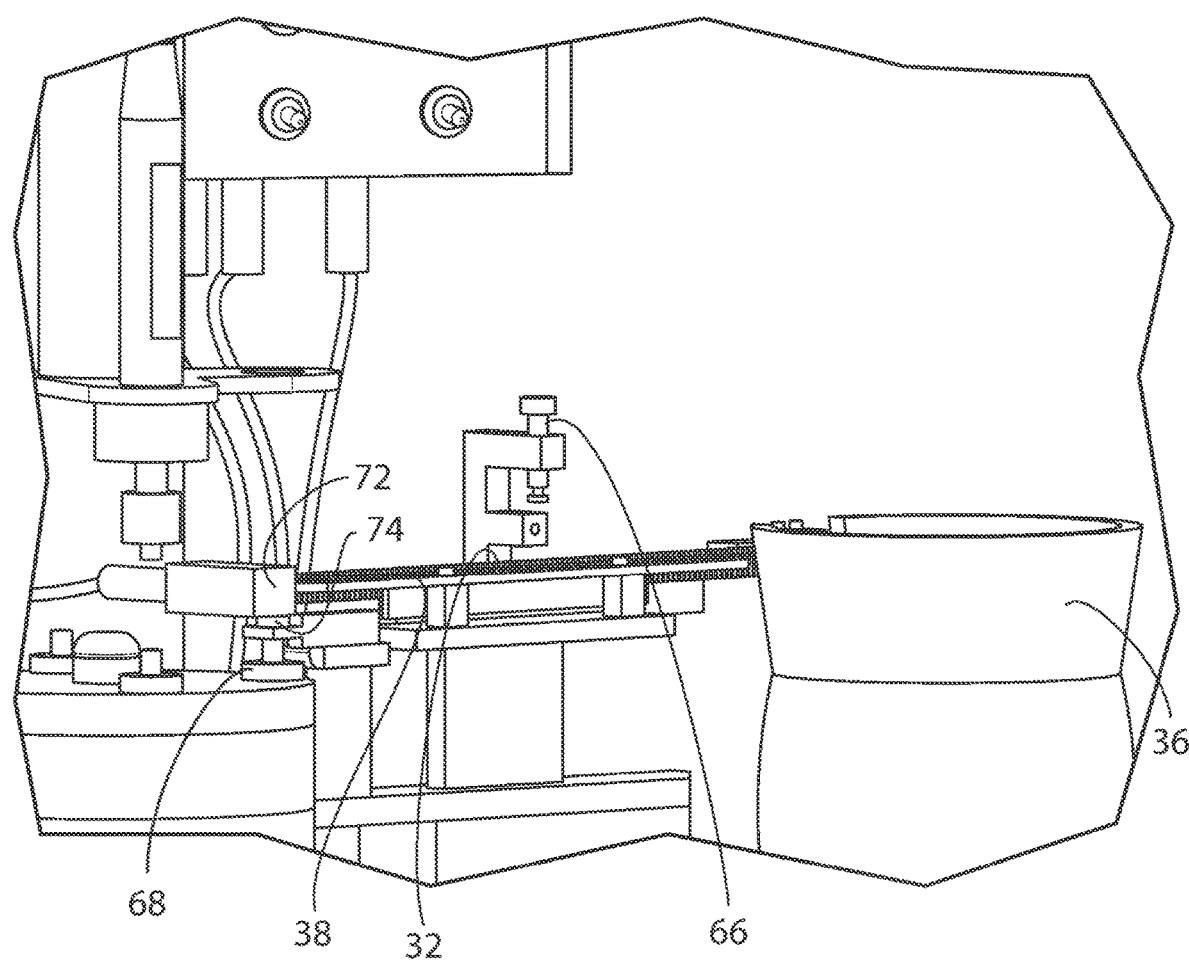
FIG. 14 is a front side perspective view of the semiautomatic machine for swaging connector pins of FIGS. 11-13 where the adapter has been removed.
Figure 15:
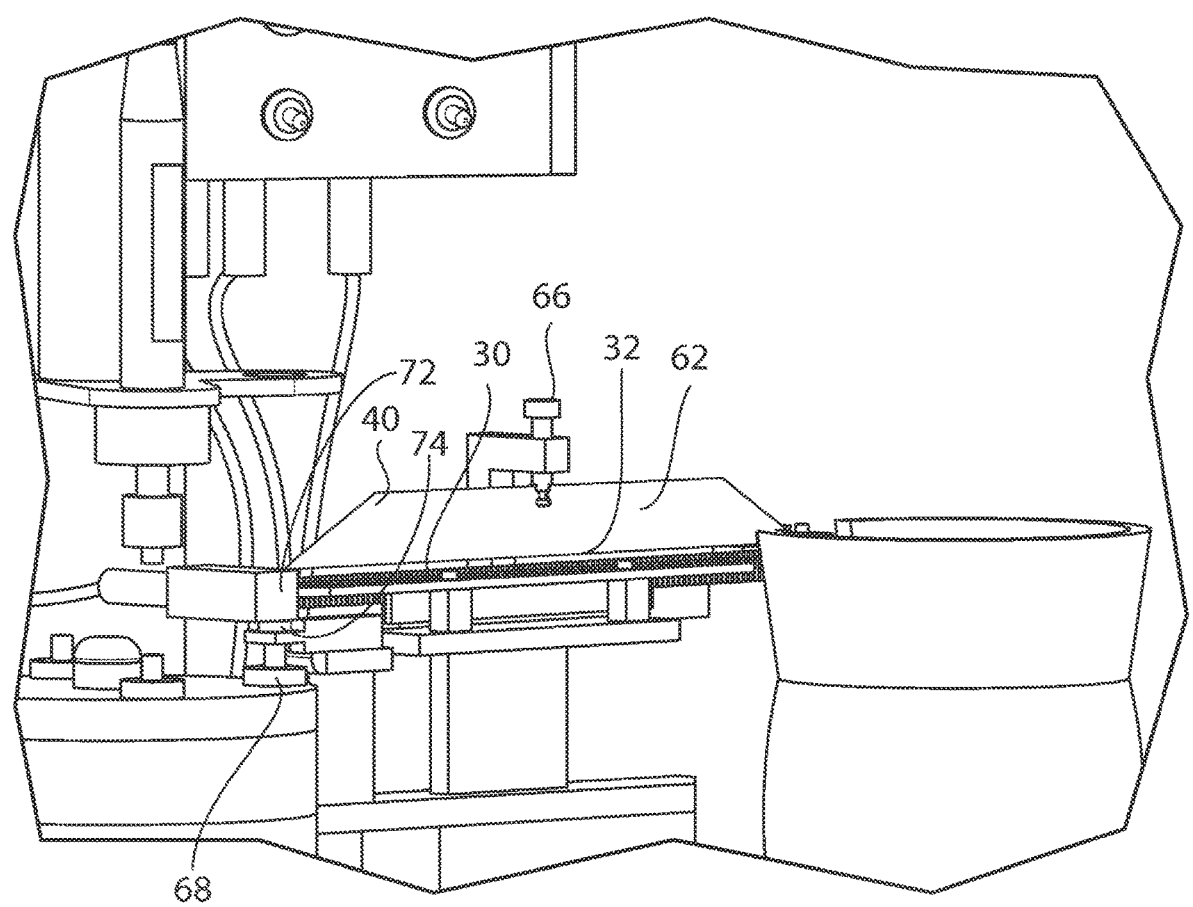
FIG. 15 is a front side perspective view of the semiautomatic machine for swaging connector pins of FIGS. 11-14 where a new adapter is installed.
Figure 16:
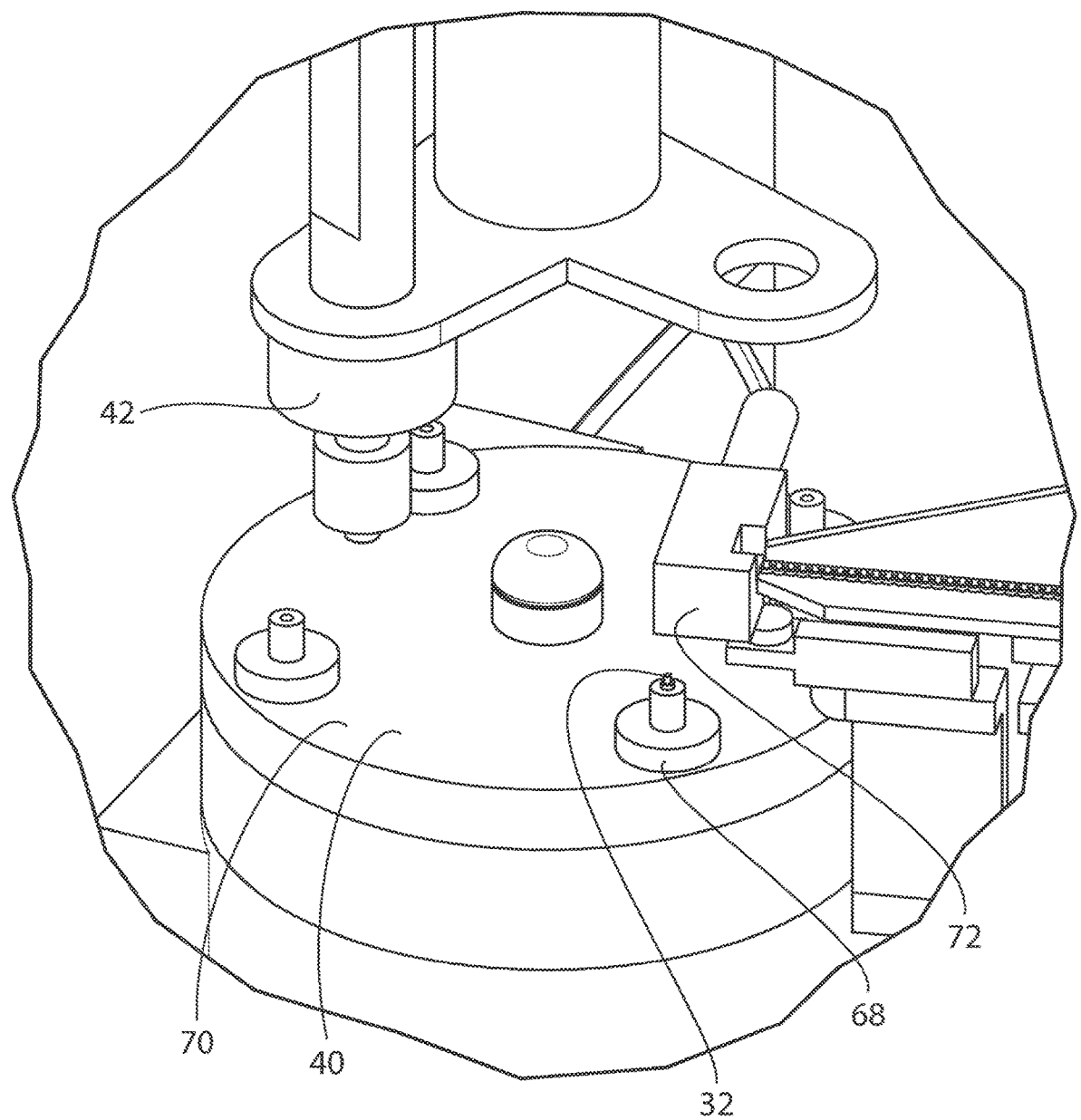
FIG. 16 is a detailed perspective view of the rotary indexer of the semiautomatic machine in an initial position.
Figure 17:
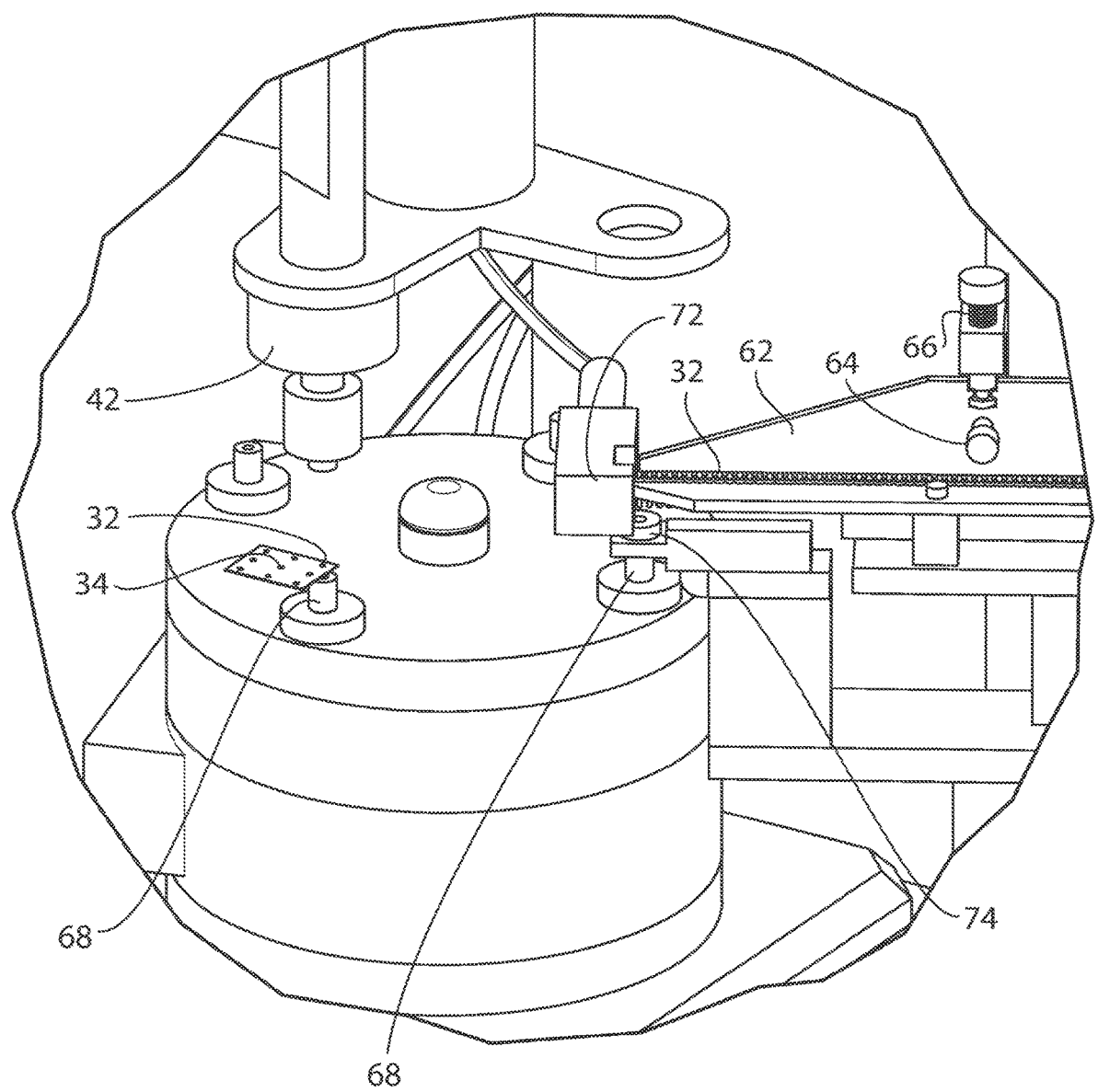
FIG. 17 is a detailed perspective view of the rotary indexer of the semiautomatic machine of FIG. 16 in a subsequent position in which a connector pin is located in an anvil holder and a circuit board is aligned with the connector pin.
Figure 18:
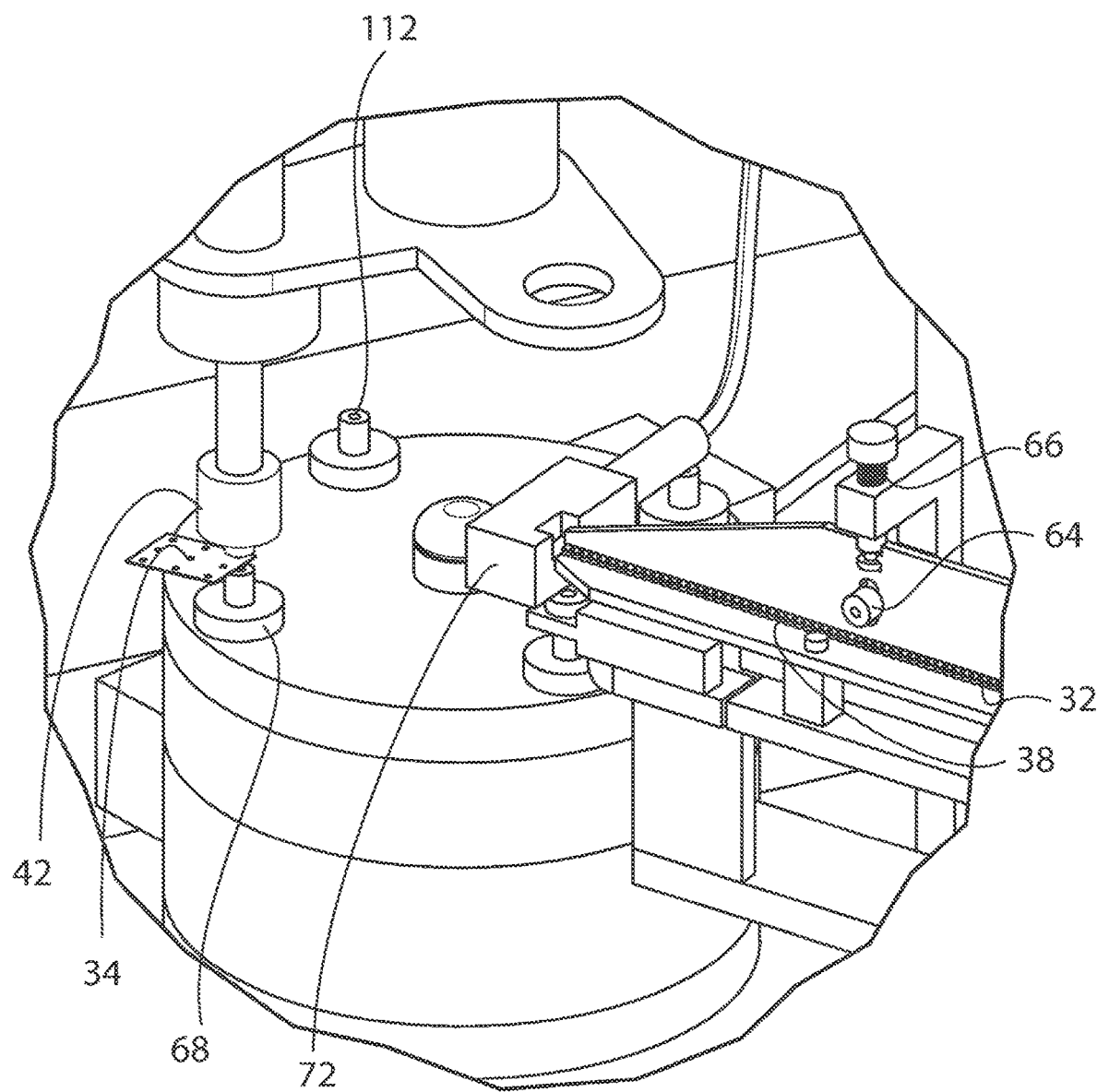
FIG. 18 is a detailed perspective view of the rotary indexer of the semiautomatic machine of FIGS. 16 and 17 in a subsequent position in which a punch compresses the connector pin against the anvil holder.
Figure 19:
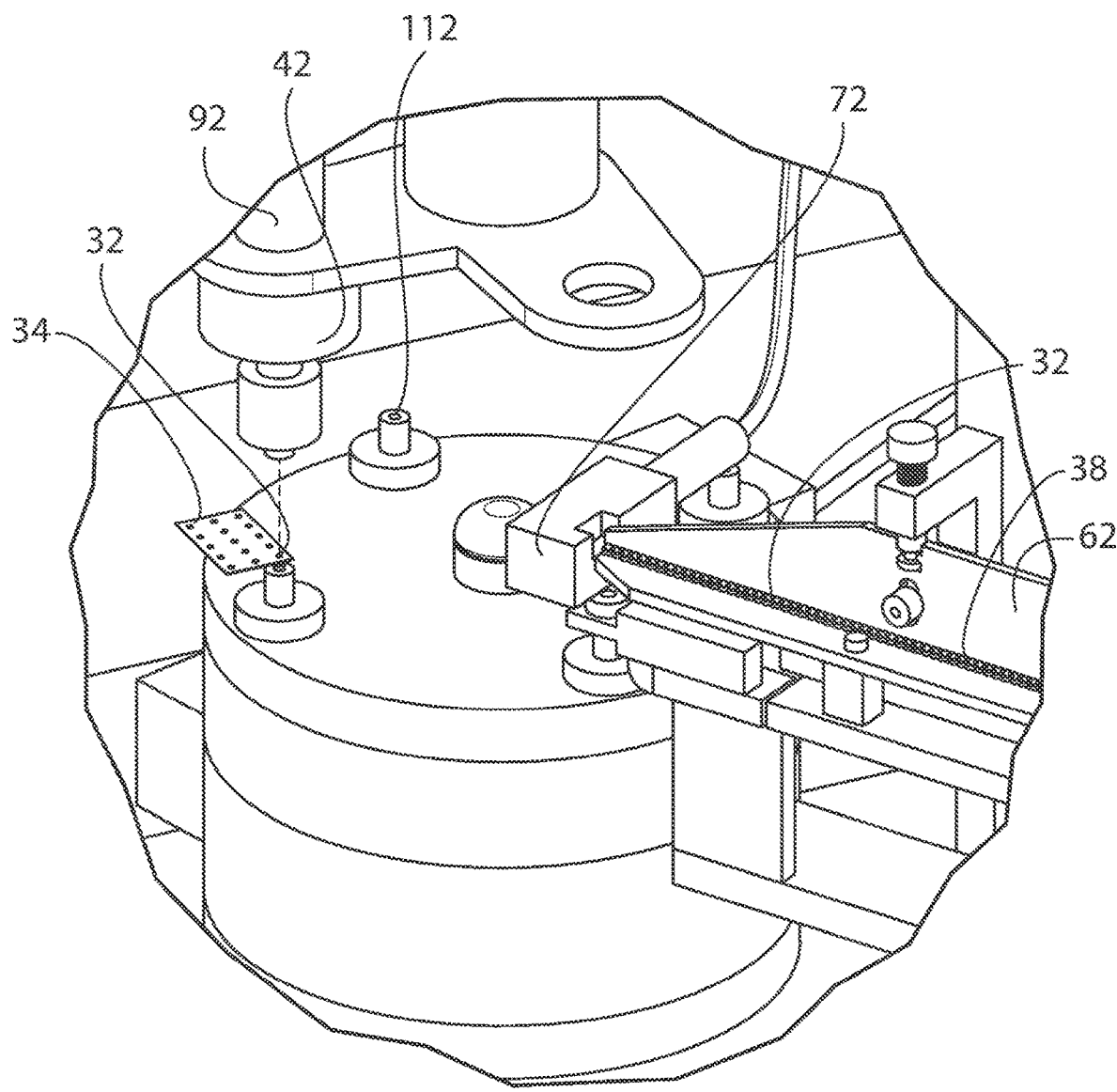
FIG. 19 is a detailed perspective view of the rotary indexer of the semiautomatic machine where a connector pin is located in an anvil holder where a different circuit board is aligned with the connector pin.
Figure 20:
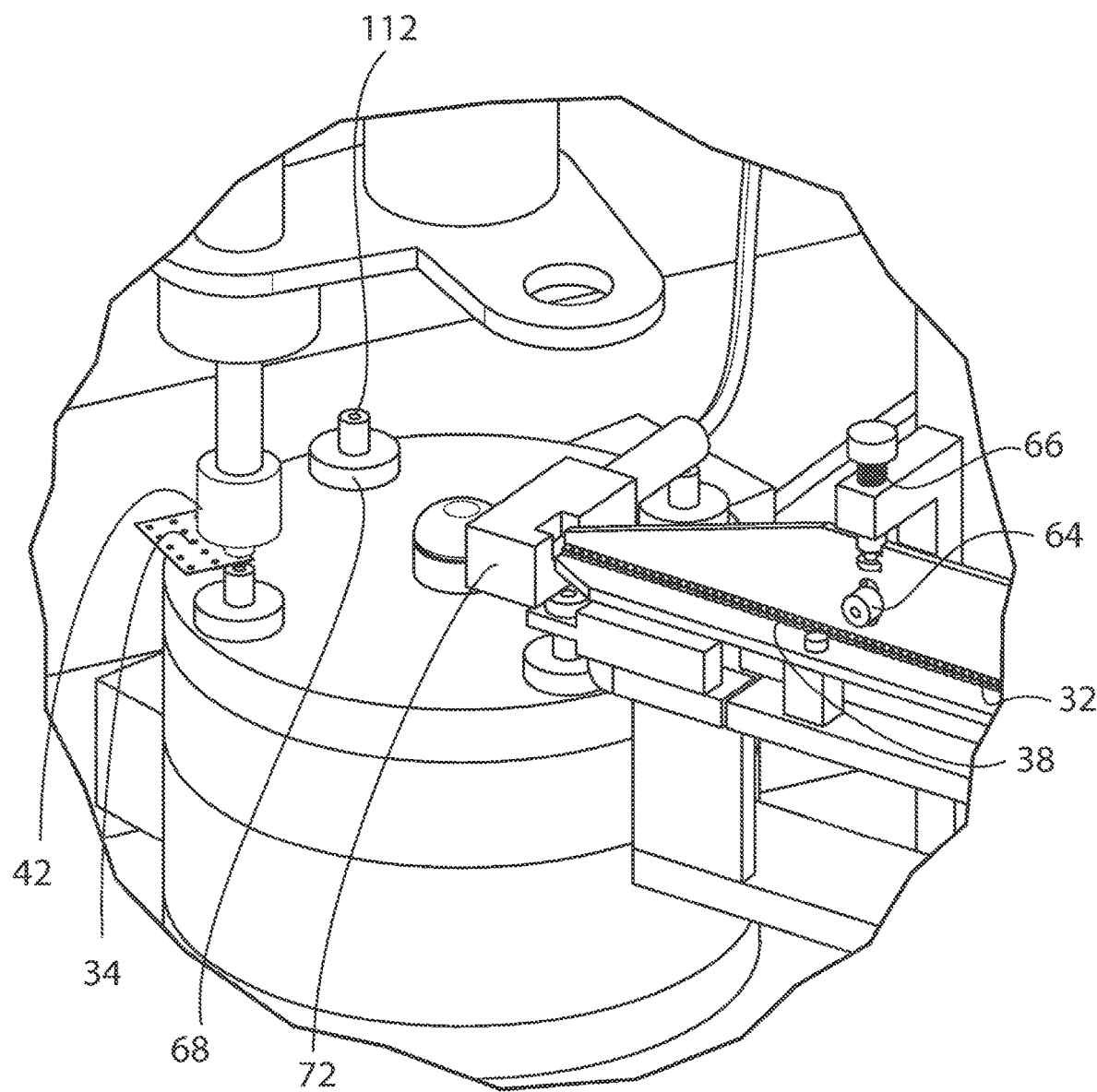
FIG. 20 is a detailed perspective view of the rotary indexer of the semiautomatic machine of FIG. 19 in a subsequent position in which a punch compresses the connector pin against the anvil holder.
Figure 21:
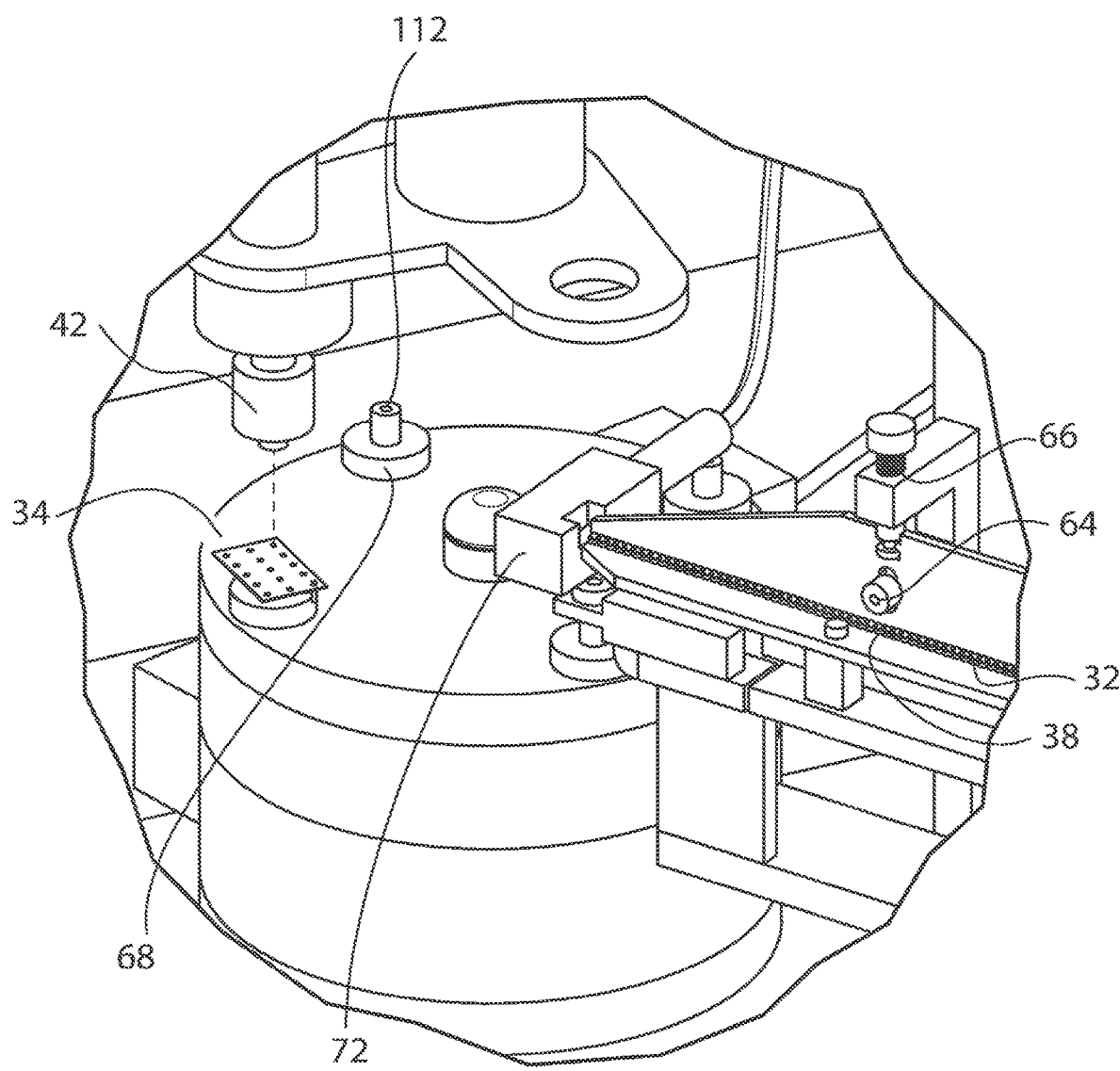
FIG. 21 is a detailed perspective view of the rotary indexer of the semiautomatic machine of FIGS. 19 and 20 where a second connector pin is aligned with the circuit board.
Figure 22:
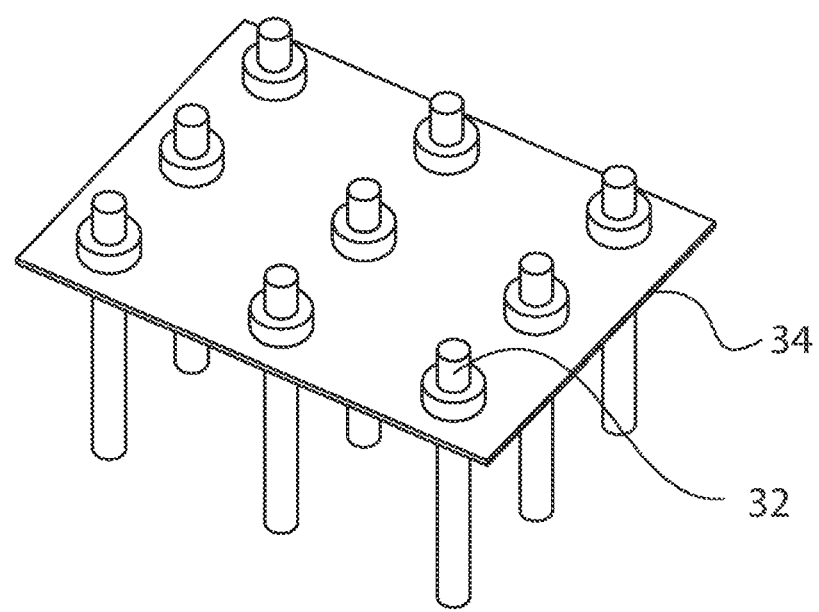
FIG. 22 is a perspective view of a circuit board assembly once the connector pins have been installed.
Figure 23:
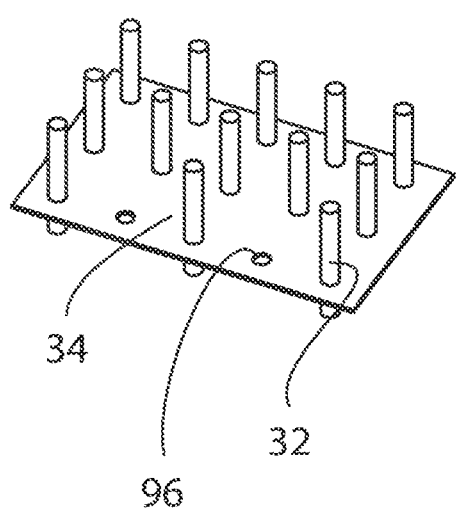
FIG. 23 is a perspective view of another embodiment of a circuit board assembly once the connector pins have been installed.
Figure 24:
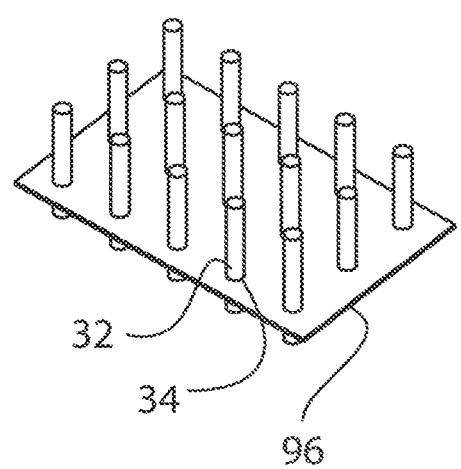
FIG. 24 is a perspective view of yet another circuit board assembly once the connector pins have been installed.

Additionally, various pin feeder track adapters 110 may be mounted to the entrance of the feeder track 38 where feeder track 38 meets the feeding bowl 36 to further help to facilitate appropriate alignment of each connector pin 32 when it enters the feeder track 38. The pin feeder track adapters 110 may take a variety of different sizes and shapes depending on the configuration of the connector pins 32 that are being swaged with the circuit board assembly 34. Thus, the pin feeder track adapters 110 help to ensure the connector pins 32 are properly aligned when they exit the feeding bowl 36 and enter the feeder track 38. In this way, the feeder track 38 transports a single-file line of connector pins 32 from the feeding bowl 36 to the rotary indexer 40 as seen in FIGS. 10 and 11.

Figure 6:
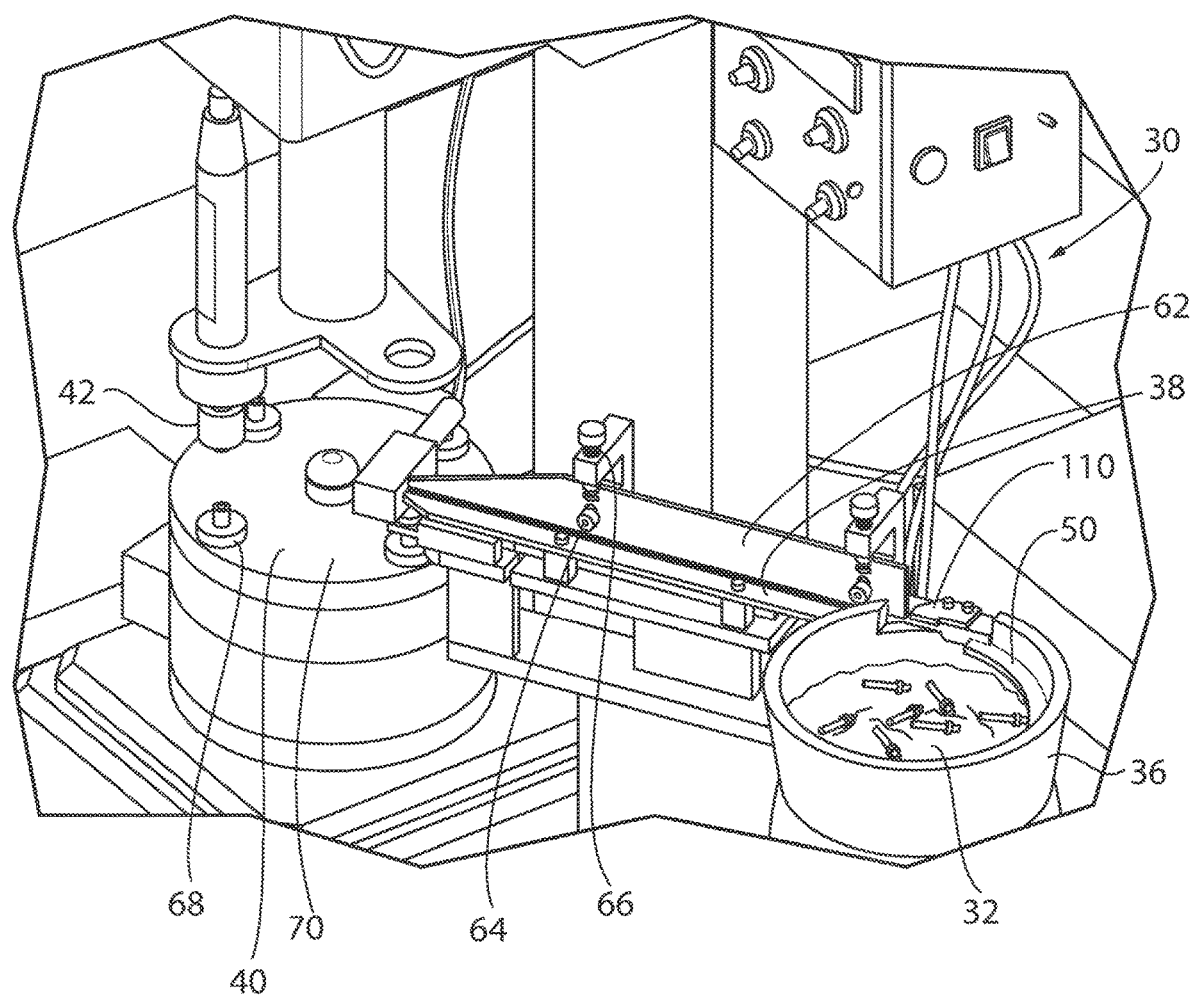
FIG. 6 is a front side perspective view of the semiautomatic machine for swaging connector pins of FIG. 5 showing the feeder bowl once a plurality of connector pins has been inserted therein.

These connector pins 32 are advanced from the feeding bowl. 36 and along the feeder track 38 based on the vibrations of the second vibrator mounted thereto. FIGS. 6-10 show the process of movement of connector pins 32. Initially, FIG. 5 shows an empty feeding bowl 36. Next, FIG. 6 shows the feeding bowl 36 filled with connector pins 32. FIGS. 7-10 show the connector pins 32 traveling up the feeding bowl 36 and feeding the feeder track 38 in light of vibration of the first vibrator and the second vibrator.

Figure 3:
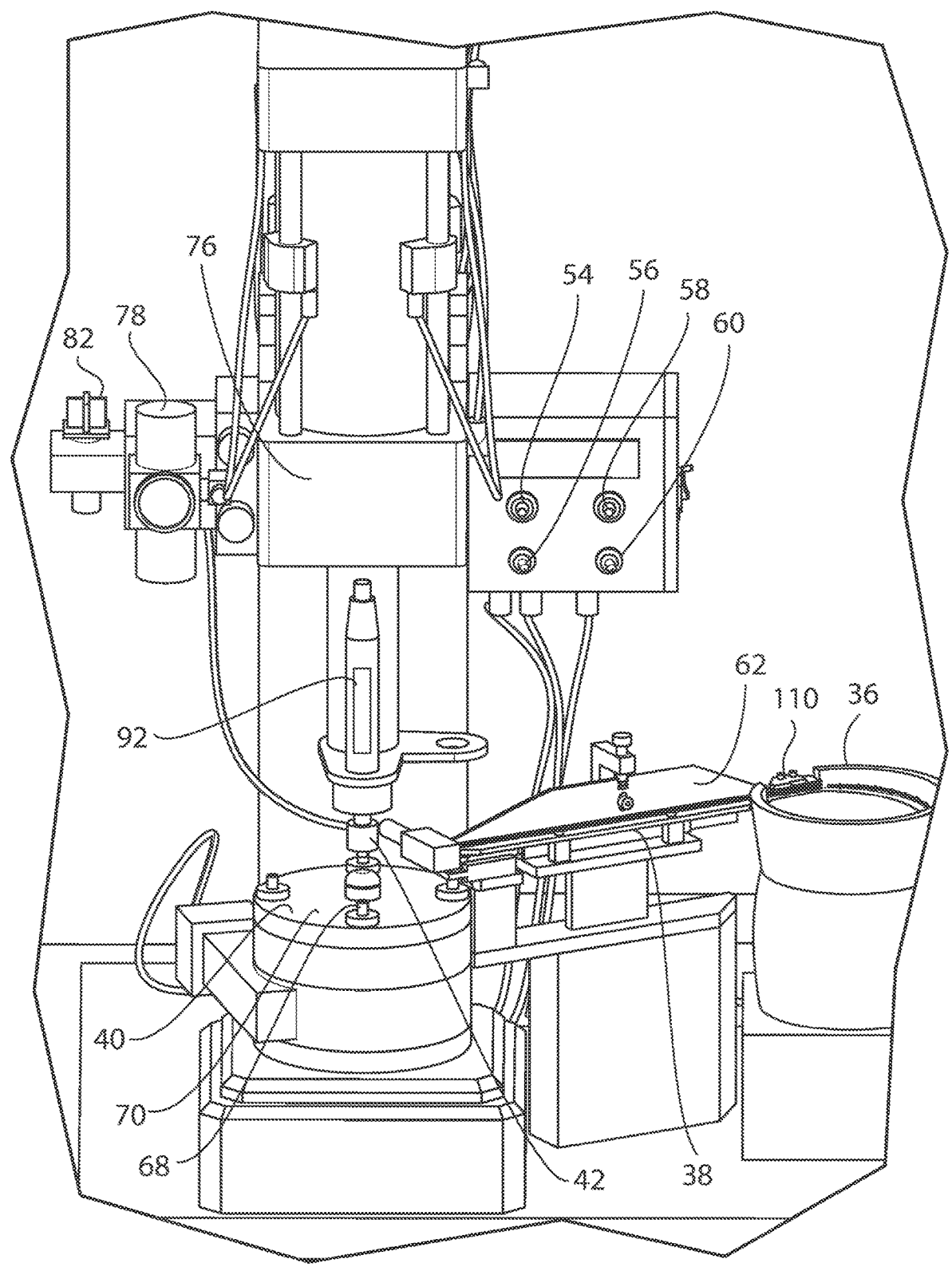
FIG. 3 is a front perspective view of the semiautomatic machine for swaging connector pins of FIGS. 1 and 2 showing a feeder bowl, the feeder track, and a rotary indexer.
Figure 4:
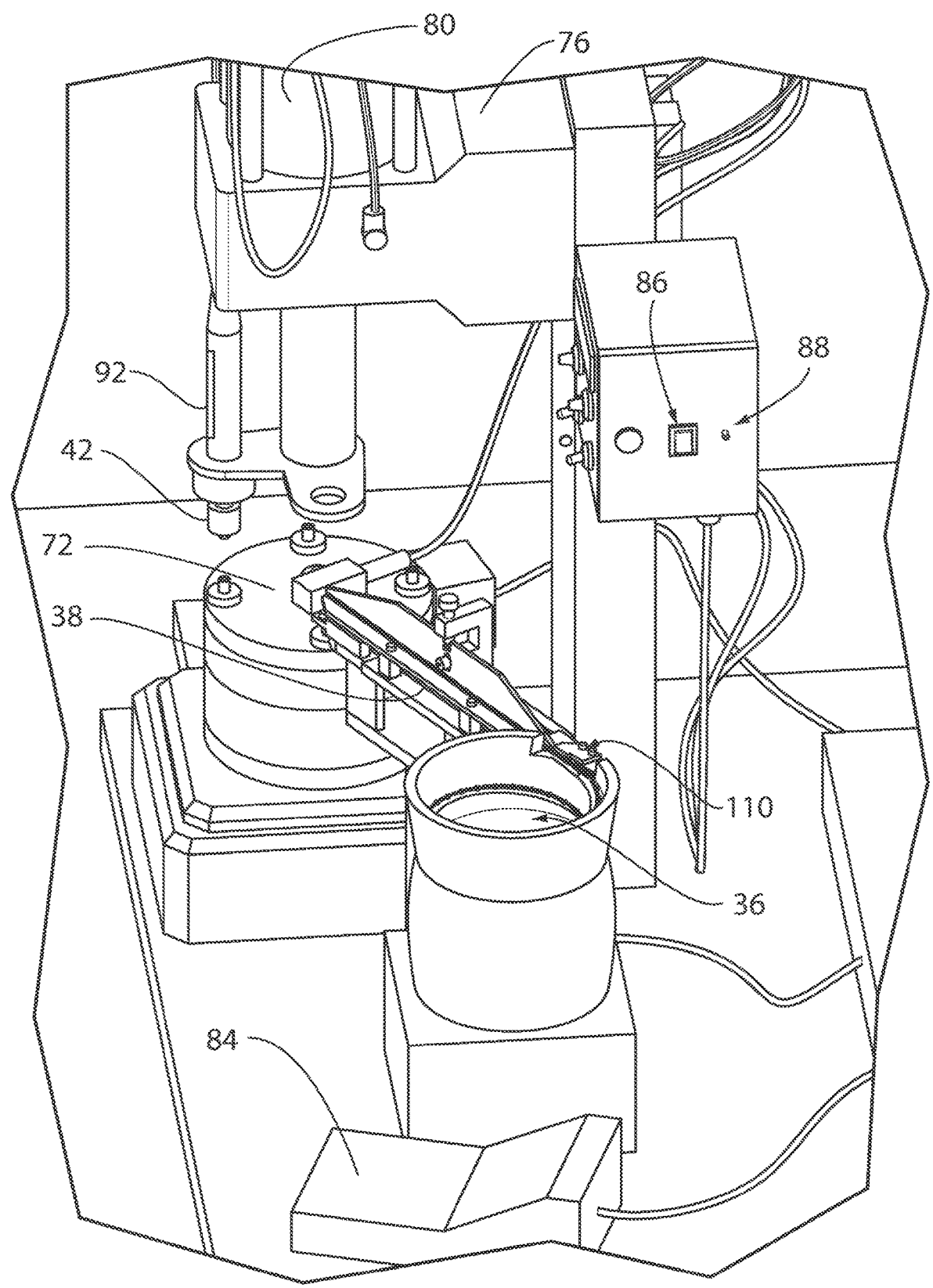
FIG. 4 is a side perspective view of the semiautomatic machine for swaging connector pins of FIGS. 1-3 showing the feeder bowl, the feeder track, and the rotary indexer.

The specific movements of the respective vibrators can be controlled using a control panel 52, best seen in FIGS. 1, 3, and 5. The illustrated control panel 52 has a vibration bowl knob 54 that allows a user to adjust the amount of vibration of the first vibrator, as well as a bowl switch 56 that enables the first vibrator to be toggled off or on. Similarly, the control panel 52 also has a vibration track knob 58 that allows a user to adjust the amount of vibration of the second vibrator along the length of the feeder track 38, as well as a track switch 60 that can be toggled off or on. Again, the knobs 54, 58 and switches 56, 60 can be seen, for instance, in FIGS. 1, 3, and 5.

Additionally, the feeder track 38 may be configured to be adjusted depending on the specific connector pins 32 that are being used. More specifically, the feeder track 38 can be adjusted vertically and/or horizontally depending on various characteristics of the connector pins 32, including the height or diameter of the connector pins 32. FIGS. 9 and 12-15 show multiple adapters 62 being installed and adjusted to enables the feeder track configuration to be changed depending on the specific connector pins 32 to be installed. For instance, the illustrated feeder track 38 includes at least one horizontal fastener 64 mounted to the adapter 62 (FIGS. 12-15), and sometimes additional horizontal fasteners 64a, 64b (FIG. 9). Although any fastener 64 may be used to releasably secure the adapter 62 in place, a horizontal screw is shown. This fastener 64 can be loosened to enable the adapter 62 to be adjusted and moved to change the height and width of the feeder track 38 depending on the connector pins 32 that are being used. Additionally, the feeder track 38 includes at least one vertical fastener 66 (FIGS. 12-15), and sometimes additional vertical fasteners 66a, 66b (FIG. 9). Again, this fastener 66 is shown as a vertical screw, but any other suitable fastener could similarly be used. Once the adapter 62 is located in a desired configuration where the feeder track 38 has the appropriate height and width, these horizontal and vertical fasteners 64, 66 can be tightened to ensure that the feeder track 38 stays in place.

The rotary indexer 40 will now be described. The rotary indexer 40 has a base 70 with plurality of anvil holders 68 formed therein, as can best be seen in FIGS. 16-21. As shown, the illustrated rotary indexer 40 is equipped with four equally-distanced anvil holders 68. Of course, the rotary indexer 40 could similarly hold additional or fewer anvil holders depending on the size of the rotary indexer 40 and operator preference. These anvil holders 68 are configured to receive the connector pins 32 from the feeder track 38. More specifically, the bottom section 102 of the connector pin 32 is dropped into an opening 112 in the anvil holder 68, and the shoulder 104 abuts the upper side 71 of the anvil holder 68. Depending on the type and size of the desired connector pins, different anvil holders 68 can be used. Different rotary indexers (not shown) with differently-sized anvil holders depending on the characteristics of the desired connector pins may be installed to the machine 30.

Figure 2:
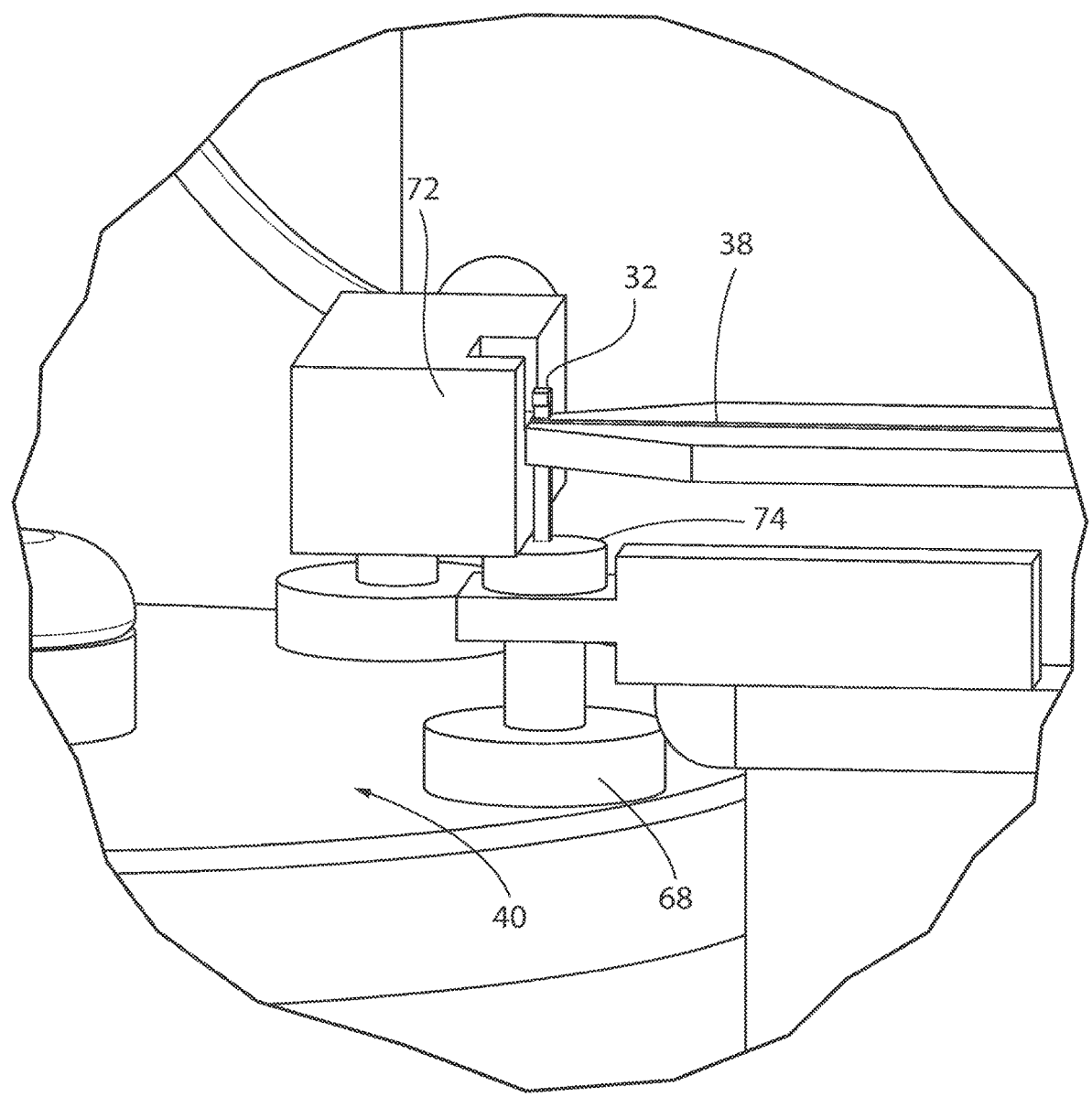
FIG. 2 is a perspective view of the semiautomatic machine for swaging connector pins of FIG. 1 showing a connector pin reaching the end of a feeder track and being dropped into a pneumatic insertion tool.

Looking to FIG. 2, once a connector pin 32 reaches the end of the feeder track 38, it enters into a pneumatic insertion tool 72. Once an empty anvil holder 68 is located directly beneath the pneumatic insertion tool 72, the connector pin 32 is inserted into the anvil holder 68. In this way, the machine 30 continuously supplies new connector pins 32 to the empty anvil holder 68 to ensure the anvil holder 68 has a connector pin 32 ready to be swaged with the circuit board assembly 34. Additionally, a pin insertion feeding adapter 74 may also be located directly adjacent to the pneumatic insertion tool 72. The respective adapter 74 can be changed depending on the specific size and type of connector pin 32 that is being fed into the anvil holder 68.

Next the punch 42 and many of its associated components will be described. As previously mentioned, the punch 42 is located directly above the rotary indexer 40 and is vertically movable towards and away from the rotary indexer 40. Additionally, an arbor press body 76 associated with the punch 42 is similarly configured to move vertically relative to the rotary indexer 40 based on the input of a user. Movement of the punch 42 downwardly towards the loaded anvil holder 68 results in the compression of the top section 100 of the pin 32 towards the circuit board assembly 34, which causes swaging of the connector pin 32 to the circuit board assembly 34. More specifically, the top section 100 is compressed into the top lip 106, such that the circuit board assembly 34 is sandwiched between the top lip 106 and the shoulder 104. As shown, the movement of the punch 42 is achieved using various conventional pneumatic features, including a pneumatic module 78, a pneumatic actuator 80, and an air lockout valve 82. The machine 30 may have other conventional controllers and features to help control movement of the punch 42, including a CNC rotary indexer controller 84, an indexer switch 86, and a power switch 88. These features may be associated with the control panel 52 or they may be independent, stand-alone parts. Use of these features will be further described below.

Movement of the punch 42 may be manually controlled by a user. For instance, as shown, the machine 30 comes equipped with a foot pedal switch 90 that can be compressed to result in the movement of the punch 42 towards the rotary indexer 40. Of course, other controllers could similarly be used. In the illustrated embodiment, after the punch 42 is moved towards the rotary indexer 40 and the swag has been completed, the punch 42 automatically returns to its original position, and the rotary indexer 40 rotates 90 degrees in a clockwise direction so that a newly-loaded anvil holder 68 having a connector pin 32 inserted into the opening 112 is located directly beneath the punch 42. Additionally, a digital micrometer 92 may be located directly adjacent to the punch 42 to allow a user to monitor the very specific vertical movements of the punch 42 relative to the rotary indexer 40.

If for whatever reason the anvil holders 68 are not appropriately aligned with the punch 42, the rotary indexer 40 can be adjusted in a few different ways. First, the machine 30 may come equipped with a manual wheel 94 associated with the rotary indexer 40. This manual wheel 94 would permit a user to manually rotate the rotary indexer 40 to a position wherein the anvil holder 68 is located directly beneath the punch 42. Once in the desired location, the wheel 94 can be tightened to secure the rotary indexer 40 in place. Alternatively, various automatic alignment devices (not shown) could be used such that the rotary indexer 40 is automatically returned to a position where the anvil holder 68 aligns with the punch 42.

Use of the machine 30 will now be described. Initially, the lockout valve 82 may be opened, and the air pressure regulator may be adjusted. For instance, the lockout valve 82 may be adjusted until a desired pressure reading of 30-40 pounds per square inch is reached. Thereafter, the power switch 88 can be turned on and the indexer switch 86 of the control panel 52 can be turned off. Once this occurs, a user can enter desired mode setting information into the CNC rotary indexer 84. Next, the indexer switch 86 may be turned on and a visual inspection of the anvil holder 68 and the punch 42 can be completed. Additionally, the foot pedal switch 90 may be activated at least one time to ensure that continued alignment of the anvil holder 68 and the punch 42 are achieved. In the event that the anvil holder 68 and punch 42 are not aligned, the indexer switch 86 can be turned off and the lockout valve 82 can be closed. After this occurs, the rotary indexer 40 can be manually adjusted to align with the punch 42 using the wheel 94. Alternatively, alignment can be achieved remotely using the CNC rotary indexer controller 84. In either scenario, the rotary indexer 40 can be moved slightly in a clockwise or counter-clockwise direction until appropriate alignment between the punch 42 and the anvil holder 68 has been achieved. Once appropriate alignment has occurred, the machine 30 can be powered back on and operation of the machine 30 can resume.

Additional adjustments may be made to the vibrators associated with the feeder track 38 and the feeding bowl 36 to ensure appropriate movement of the connector pins 32 from the feeding bowl 36, along the feeder track 38, and to the rotary indexer 40. Once the machine 30 has been appropriately calibrated, operation of the machine 30 can begin. As can best be seen in FIGS. 17-21, a user places the circuit board assembly 34 at a location where the connector pin 32 is located directly adjacent to an opening 96 formed in the circuit board assembly 34. Once this alignment occurs, the foot pedal switch 90 can be activated, which results in the punch 42 moving toward the circuit board assembly 34 and anvil holder 68. The punch 42 presses the connector pin 32 against the circuit board assembly 34, which causes the top section 100 to be compressed to form a top lip 106. As a result, the circuit board assembly 34 is held between the shoulder 104 and the top lip 106 such that the connector pin 32 is attached to the circuit board assembly 34.

It should be understood that the above description, while indicating representative embodiments of the present invention, is given by way of illustration and not of limitation. Many changes and modifications may be made within the scope of the present invention without departing from the spirit thereof, and the invention includes all such modifications.

Various additions, modifications, and rearrangements are contemplated as being within the scope of the following claims, which particularly point out and distinctly claim the subject matter regarding as the invention, and it is intended that the following claims cover all such additions, modifications, and rearrangements.

What is claimed is:

1. A machine for automated assembly of a workpiece and at least one connector pin comprising:
   an indexer;
   wherein the indexer is configured to position at least one anvil holder, wherein the indexer positions the at least one anvil holder at a first position of the indexer where the at least one anvil holder is configured to receive a connector pin; and a punch, wherein the punch is configured to move along an axis to press against the at least one anvil holder to secure the connector pin to the workpiece when the indexer positions the at least one anvil holder with the received connector at a second position of the indexer different from the first position of the indexer, the axis being offset from the indexer.

2. The machine of claim 1, further comprising an actuation switch;

wherein the actuation switch is configured to move the punch along the axis towards the indexer when actuated.

3. The machine of claim 1, further comprising:

a feeding bowl for containing connector pins; and a track extending from the feeding bowl to the indexer;

wherein the track is configured to accept the connector pins from the feeding bowl and deposits the connector pin into the at least one anvil holder at the first position, and wherein the connector pins comprise the connector pin.

4. The machine of claim 3, further comprising:

a first vibrator attached to the feeding bowl to encourage movement of the connector pins towards the track; and a second vibrator attached to the track to encourage movement of the connector pins along the track toward the indexer.

5. The machine of claim 4, further comprising:

a first control input associated with the first vibrator attached the feeding bowl configured to increase or decrease a first amount of vibration of the feeding bowl; and a second control input associated with the second vibrator attached to the track configured to increase or decrease a second amount of vibration of the track.

6. The machine of claim 3, wherein the track is adjustable to accept connector pins of different dimensions.

7. The machine of claim 6, wherein the track is adjustable in at least one of a first direction based on a height of the connector pins, a second direction based on a diameter of the connector pins, or a combination thereof.

8. The machine of claim 3, further comprising an adapter attached to the track, wherein the adapter is configured to enable the track to accept connector pins of different dimensions.

9. The machine of claim 1, wherein the connector pin comprises:

a top section;

a bottom section; and a shoulder located between the top section and the bottom section;

wherein when the punch presses against the at least one anvil holder the top section of the connector pin is compressed to form a top lip and the workpiece is secured between the shoulder and the top lip of the connector pin.

10. The machine of claim 1, the workpiece is a circuit board.

11. The machine of claim 1, wherein the punch is pneumatically powered.

12. The machine of claim 1, comprising multiple anvil holders, wherein when a first of the multiple anvil holders is at the first position a second of the multiple anvil holders is at the second position.

13. The machine of claim 12, wherein the multiple anvil holders are equally spaced about the indexer.

14. The machine of claim 1, wherein the indexer is a rotary indexer.

15. The machine of claim 1, comprising a pin insertion tool, wherein the pin insertion tool inserts the connector pin into the at least one anvil holder when the at least one anvil holder is at the first position.

16. The machine of claim 1, further comprising means for delivering the connector pin to the at least one anvil holder.

* * * * *